(12) United States Patent
Shuy

(10) Patent No.: US 7,811,880 B2
(45) Date of Patent: Oct. 12, 2010

(54) FABRICATION OF RECORDABLE ELECTRICAL MEMORY

(75) Inventor: Geoffrey Wen-Tai Shuy, Ma On Shan (HK)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 382 days.

(21) Appl. No.: 11/870,215

(22) Filed: Oct. 10, 2007

(65) Prior Publication Data

US 2008/0286955 A1 Nov. 20, 2008

Related U.S. Application Data

(60) Provisional application No. 60/917,740, filed on May 14, 2007.

(51) Int. Cl.
*H01L 21/00* (2006.01)
(52) U.S. Cl. .............. 438/237; 438/245; 438/257; 438/264; 257/E21.422; 257/E21.689; 257/E27.086; 257/E27.102; 257/E27.103
(58) Field of Classification Search .............. 438/211, 438/237–264, 381; 257/E21.422, 648–689, 257/27.085–103
See application file for complete search history.

(56) References Cited

U.S. PATENT DOCUMENTS

| | | | | |
|---|---|---|---|---|
| 4,219,834 A | * | 8/1980 | Esch et al. .................. 257/296 |
| 5,217,917 A | * | 6/1993 | Takahashi et al. ............. 365/72 |
| 5,233,210 A | * | 8/1993 | Kodama ...................... 257/315 |
| 5,750,428 A | * | 5/1998 | Chang ......................... 438/264 |
| 5,897,983 A | * | 4/1999 | Hirota et al. ................. 430/317 |
| 5,912,839 A | | 6/1999 | Ovshinsky et al. |
| 5,989,759 A | * | 11/1999 | Ando et al. .................... 430/22 |
| 6,055,180 A | | 4/2000 | Gudesen et al. |

(Continued)

FOREIGN PATENT DOCUMENTS

CN 1267389 9/2000

(Continued)

OTHER PUBLICATIONS

*International Search Report* for PCT/CN2007/07030, mailed Nov. 8, 2007 (6 pages).
U.S. Appl. No. 11/503,671, filed Aug. 14, 2006, Shuy et al.

*Primary Examiner*—Michael S Lebentritt
(74) *Attorney, Agent, or Firm*—Stuart T. Auvinen; gPatent LLC

(57) ABSTRACT

A memory cell of a memory device is fabricated by forming a first electrode on a substrate, positioning a photo mask at a first position relative to the substrate, and forming a first material layer on the first electrode based on a pattern on the photo mask. The photo mask is positioned at a second position relative to the substrate, and a second material layer is formed above the first material layer based on the pattern on the photo mask, the second material layer being offset from the first material layer so that a first sub-cell of the memory cell includes the first material layer and not the second material layer, and a second sub-cell of the memory cell includes both the first and second material layers. A second electrode is formed above the first and second material layers.

25 Claims, 23 Drawing Sheets

U.S. PATENT DOCUMENTS

| | | |
|---|---|---|
| 6,066,537 A | 5/2000 | Poh |
| 6,101,120 A * | 8/2000 | Ishida ................. 365/156 |
| 6,584,029 B2 | 6/2003 | Tran et al. |
| 6,690,597 B1 | 2/2004 | Perlov et al. |
| 6,713,231 B1 * | 3/2004 | Hasegawa et al. ........... 430/311 |
| 6,777,762 B2 * | 8/2004 | Chang ................. 257/390 |
| 6,958,292 B2 * | 10/2005 | Hasegawa et al. ........... 430/311 |
| 7,023,014 B2 | 4/2006 | Morimoto et al. |
| 7,090,949 B2 * | 8/2006 | Nojima et al. ................. 430/5 |
| 7,312,020 B2 * | 12/2007 | Lin et al. ................. 430/322 |
| 2002/0028391 A1 * | 3/2002 | Nakao ................. 430/5 |
| 2002/0155395 A1 * | 10/2002 | Nakao ................. 430/394 |
| 2002/0190350 A1 | 12/2002 | Kozicki et al. |
| 2003/0003675 A1 | 1/2003 | Hsu |
| 2004/0062083 A1 | 4/2004 | Layman et al. |
| 2004/0223357 A1 | 11/2004 | Gilton |
| 2005/0036368 A1 | 2/2005 | Yeh et al. |
| 2005/0036386 A1 | 2/2005 | Demone |
| 2005/0100829 A1 * | 5/2005 | Lin et al. ................. 430/322 |
| 2005/0237783 A1 | 10/2005 | Lee |
| 2008/0042171 A1 * | 2/2008 | Mosler et al. ................. 257/288 |
| 2008/0220573 A1 * | 9/2008 | Takahashi et al. ........... 438/211 |
| 2010/0155802 A1 * | 6/2010 | Ohuchi ................. 257/306 |

FOREIGN PATENT DOCUMENTS

| | | |
|---|---|---|
| CN | 1411074 | 4/2003 |
| CN | 1581489 | 2/2005 |

* cited by examiner

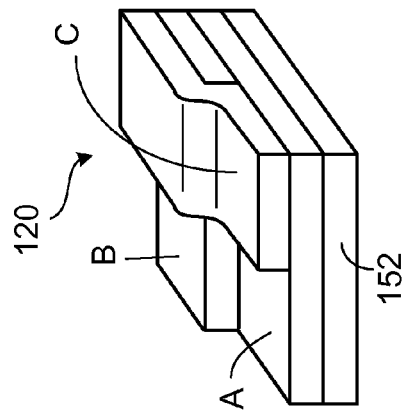
FIG. 5B
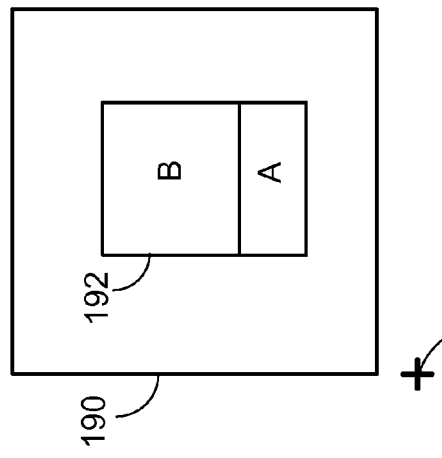
FIG. 5A
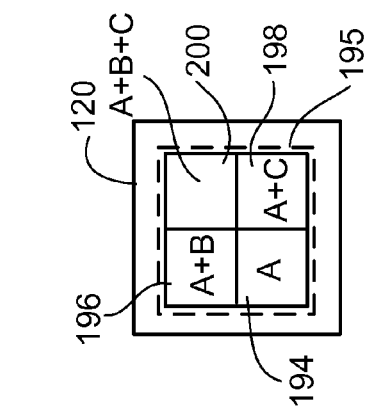
FIG. 5D
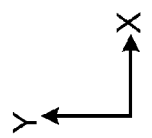
FIG. 5E
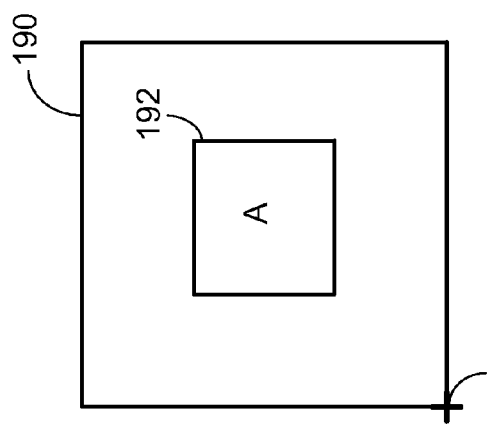
FIG. 5C
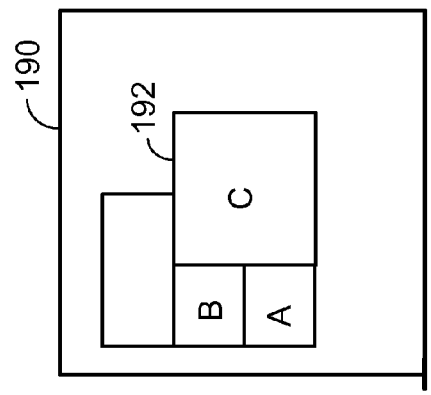

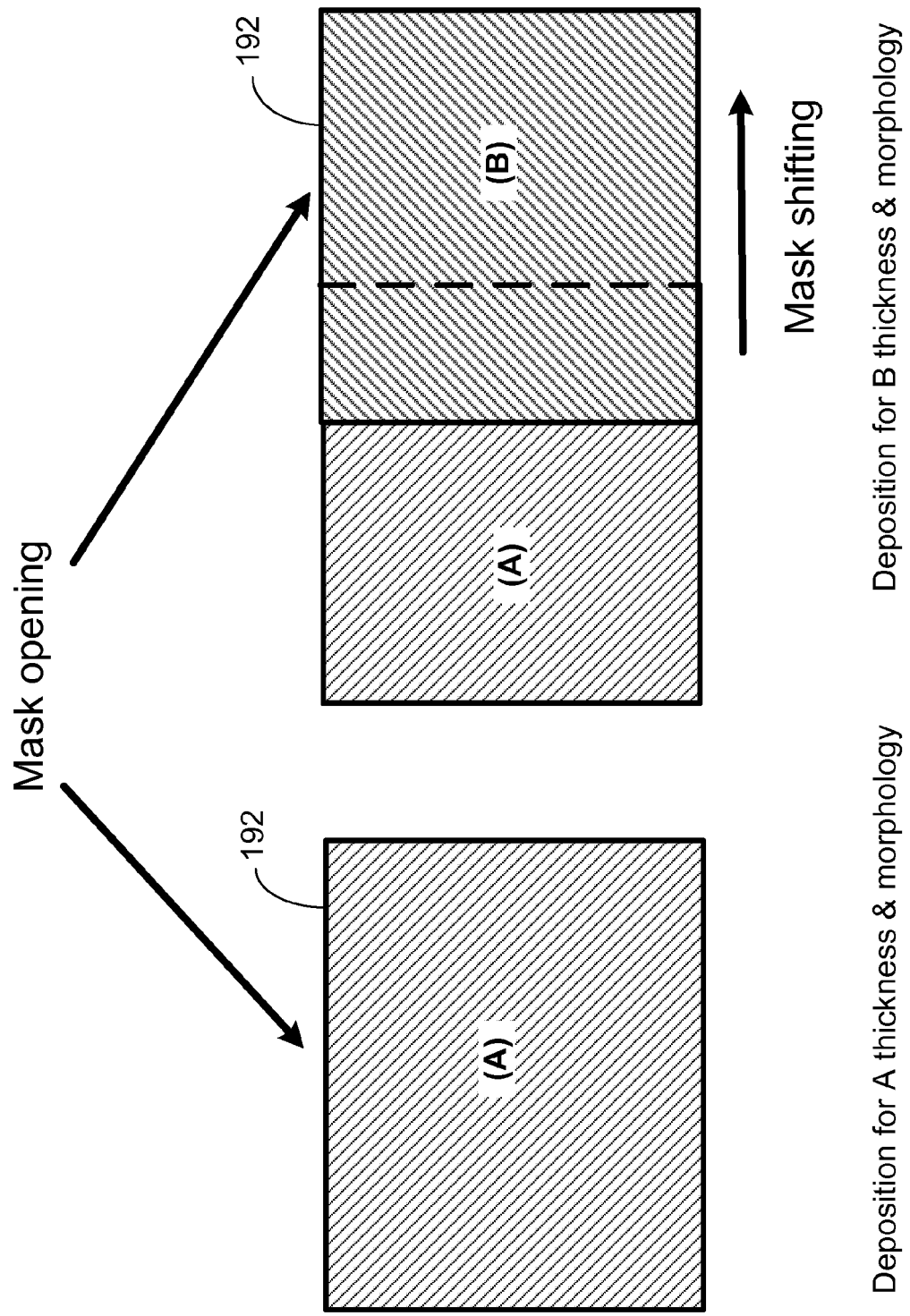

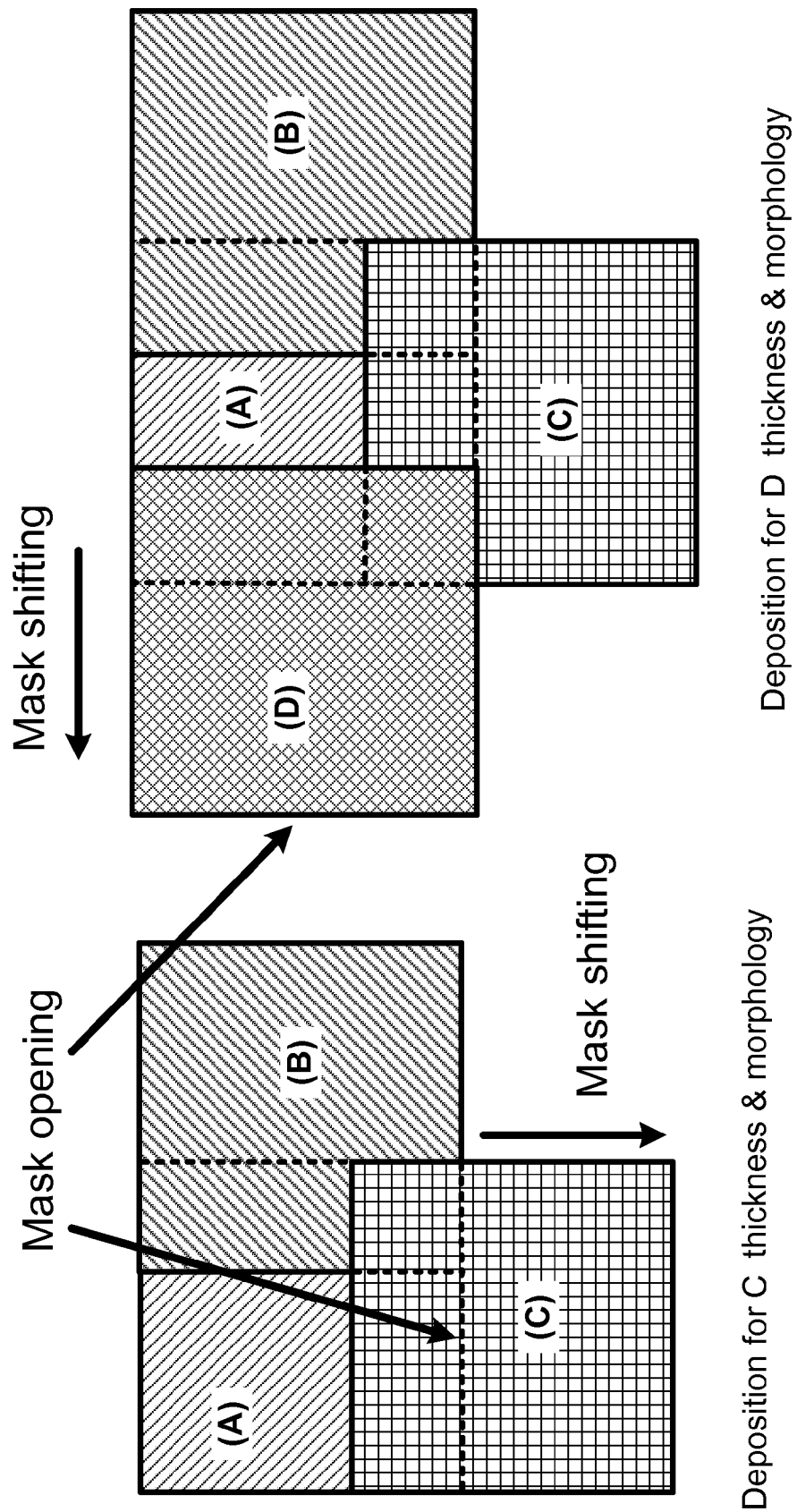

Resulting 9 sub-areas that have 5 different thickness & morphology combined

Deposition for E thickness & morphology

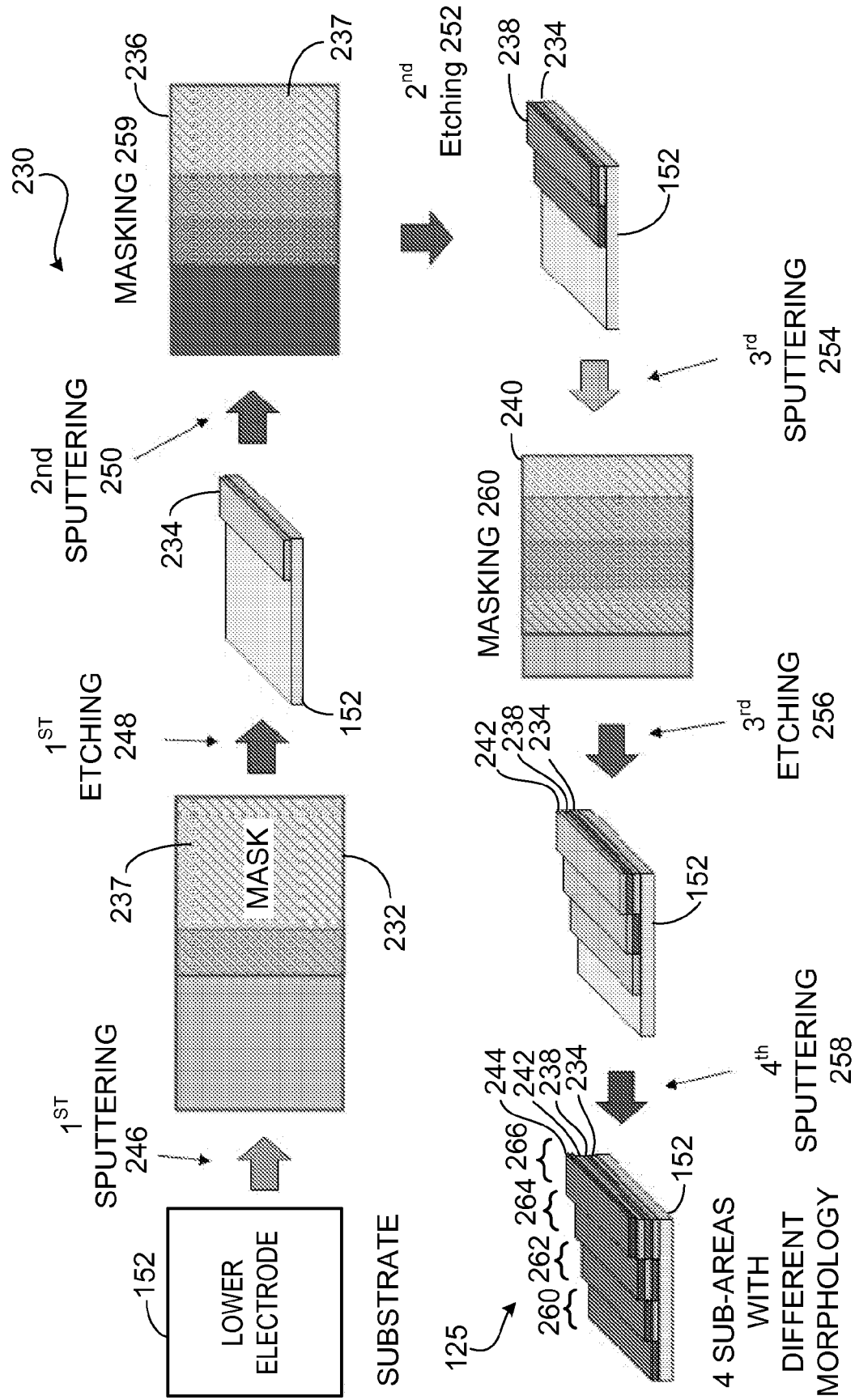

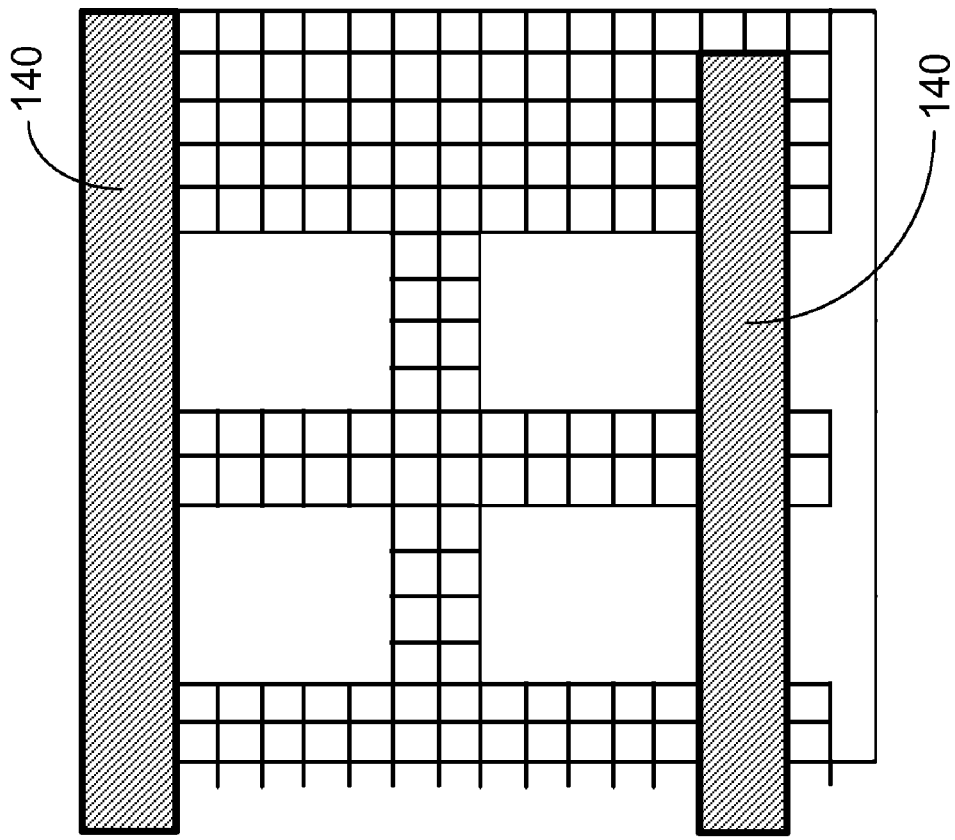
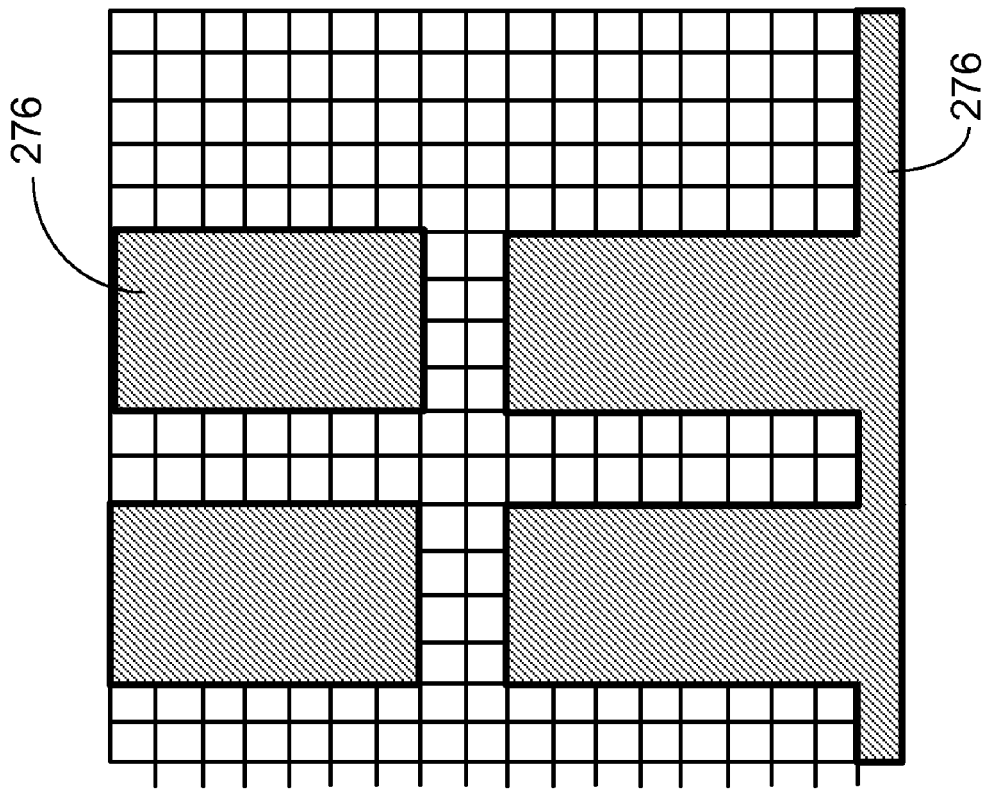
FIG. 11C
FIG. 11B

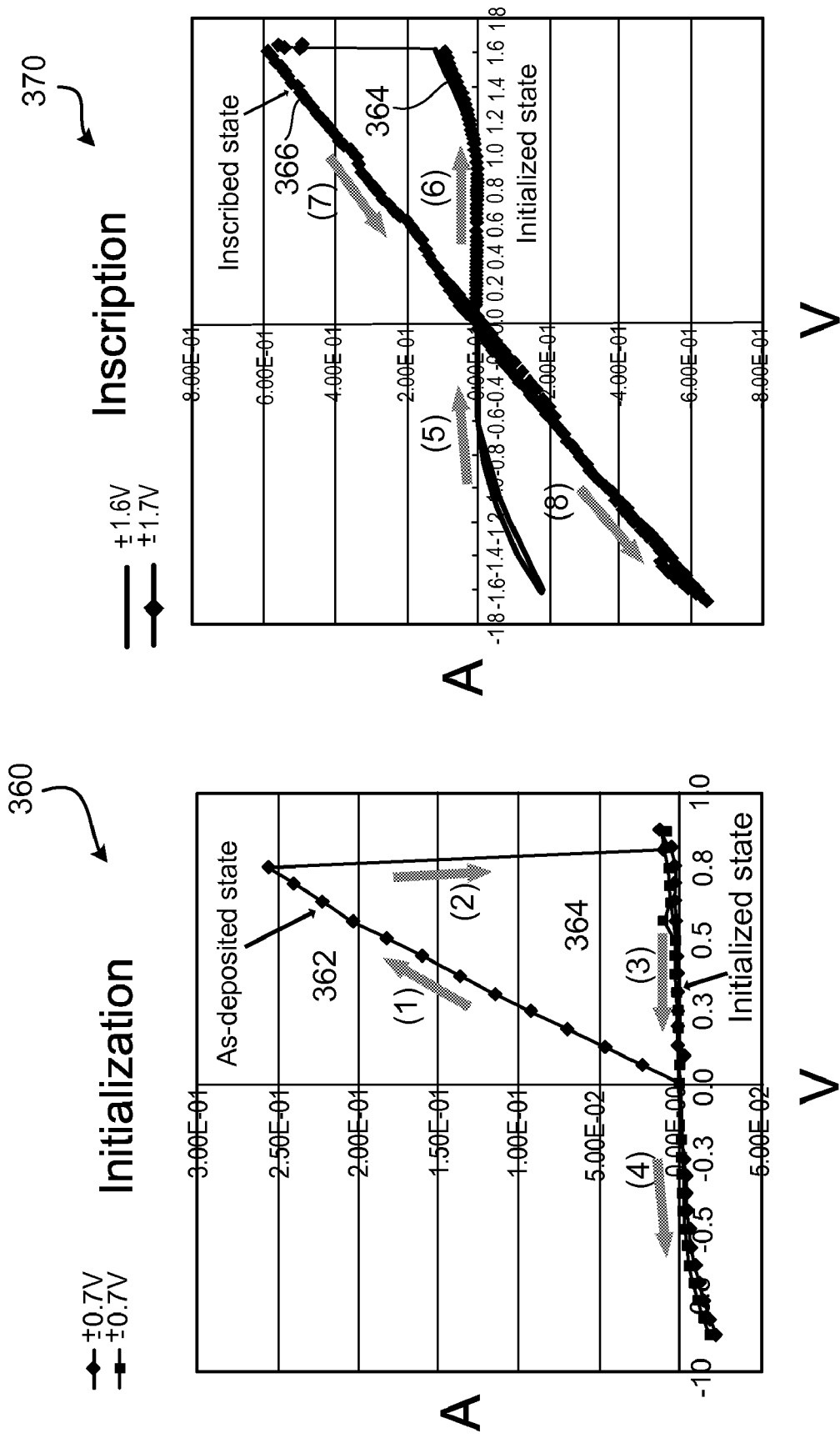

FABRICATION OF RECORDABLE ELECTRICAL MEMORY

CROSS-REFERENCE TO RELATED APPLICATIONS

This application claims the benefit of U.S. Provisional Application Ser. No. 60/917,740, filed May 14, 2007. This application is related to U.S. patent application Ser. No. 11/855,532, titled "Recordable Electrical Memory", filed on Sep. 14, 2007, and U.S. patent application Ser. No. 11/855,537, titled "Recordable Electrical Memory", filed on Sep. 14, 2007. The contents of the above applications are incorporated herein by reference.

BACKGROUND

This invention relates to fabrication of recordable electrical memory.

Non-volatile memory (NVM) has found its usage in several major application areas, such as program storage for microcontroller units (MCU), read only memory (ROM), multimedia content storage, and Flash memory cards. Both ROM and Flash memory include an array of addressable memory cells. Word lines and bit lines define the address of each cell. In Flash memory devices, each cell includes a floating gate metal oxide semiconductor (MOS) transistor, in which an electrically isolated floating gate is used to store charges. Flash memory devices have different types of architectures, such as NOR flash or NAND flash, that are suitable for different applications. Another example of a non-volatile memory device uses an electrically writeable and erasable phase change material that can be switched between generally amorphous and generally crystalline states.

SUMMARY

In a general aspect, information is recorded in a non-volatile electrical memory through a change of one or more material properties of a recordable layer. The recordable layer may include one or more thin layers of materials. Electrical circuitry, such as electrical conductors, are arranged such that at different locations of the layer the circuitry can (1) perform inscription by introducing a current through the layer thereby changing material and electrical properties at that location and/or (2) perform reading by sensing the electrical properties, such as resistance, at that location.

In another general aspect, information is recorded in a non-volatile electrical memory by generating contrast between different states of memory cells, the states including an initialized state and one or more inscribed states. Information is read from each of the memory cells by comparing a value read from the memory cell to one or more preset values and determining whether the memory cell is in the initial state or one of the inscribed states. For example, the value can be a resistance value.

In another general aspect, information is recorded in a non-volatile electrical memory by generating contrast in resistance using one or more thin layers of organic and/or inorganic material.

In another general aspect, a method for fabricating a memory cell of a memory device includes forming a first electrode on a substrate, positioning a photo mask at a first position relative to the substrate, and forming a first material layer on the first electrode based on a pattern on the photo mask. The photo mask is positioned at a second position relative to the substrate, and a second material layer is formed above the first material layer based on the pattern on the photo mask, the second material layer being offset from the first material layer so that a first sub-cell of the memory cell includes the first material layer and not the second material layer, and a second sub-cell of the memory cell includes both the first and second material layers. A second electrode is formed above the first and second material layers.

Implementations of the method can have one or more of the following features. The method includes positioning the photo mask at a third position and forming a third material layer above the first and second material layers based on the pattern on the photo mask, the third material layer being between the first electrode and the second electrode, the third material layer being offset from the first and second material layers so that the memory cell includes at least the first sub-cell, the second sub-cell, and a third sub-cell. The first sub-cell includes the first material and not the second or third material layers, whereas the second sub-cell includes the first and second material layers and not the third material layer. The third sub-cell includes the first and third material layers and not the second material layer. The memory cell includes a fourth sub-cell that includes the first, second, and third material layers. The distance between the first position and the second position is less than a smallest line width of the photo mask.

In some examples, the method includes positioning the photo mask at a fourth position and forming a fourth material layer above the first, second, and third material layers based on the pattern on the photo mask, the fourth layer being between the first electrode and the second electrode, the fourth material layer being offset from the first, second, and third material layers so that the memory cell comprises at least the first sub-cell, the second sub-cell, the third sub-cell, and a fourth sub-cell. In some examples, the method includes positioning the photo mask at a fifth position and forming a fifth material layer above the first, second, third, and fourth material layers based on the pattern on the photo mask, the fifth material layer being offset from the first, second, third, and fourth material layers so that the memory cell comprises at least the first sub-cell, the second sub-cell, the third sub-cell, the fourth sub-cell, and a fifth sub-cell.

Positioning the photo mask at the second position includes shifting the photo mask for a distance from the first position to the second position in which the distance is less than a smallest line width of the photo mask. Forming the first layer includes forming a layer of material having openings, the openings to allow portions of the first electrode to electrically contact portions of the second electrode. Forming the first material layer includes forming a semiconductor layer or a dielectric layer. The method includes forming circuitry for applying a write signal to the memory cell. The method includes forming circuitry for outputting a read signal from the memory cell.

In another general aspect, a method includes fabricating sub-cells of a memory cell by positioning a photo mask at different positions and depositing material layers based on the photo mask at each of the different positions, different sub-cells having different material layers or different combinations of material layers.

In another general aspect, a method includes fabricating a memory device having memory cells, each memory cell having at least two sub-cells, including positioning a photo mask at two or more positions, the photo mask having a predetermined pattern, and for each position of the photo mask, forming at least one material layer based on the predetermined pattern of the photo mask to cause different sub-cells to have different material layers or different combinations of material layers.

Implementations of the method can have one or more of the following features. Fabricating the sub-cells includes positioning the photo mask at three positions to form four sub-cells. Fabricating the sub-cells includes positioning the photo mask at five positions to form nine sub-cells. In some examples, fabricating the sub-cells includes depositing a first layer on a lower electrode, adjusting an alignment of the photo mask, and depositing a second layer on the first layer. A first sub-cell includes the first layer and not the second layer, and a second sub-cell includes both the first and second layers. In some examples, fabricating the sub-cells includes depositing a first layer on a lower electrode, etching the first layer, adjusting an alignment of the photo mask, depositing a second layer on the first layer and an exposed portion of the lower electrode, and etching the second layer. A first sub-cell includes the second layer and not the first layer, and a second sub-cell includes both the first and second layers.

Each material layer has a portion that overlaps a portion of another material layer. Positioning the photo mask at two or more positions includes positioning the photo mask a first position and a second position spaced apart from the first position by a distance that is less than a smallest line width of the photo mask. Forming at least one material layer for each position of the photo mask includes forming a layer of material having openings, the openings allowing portions of the first electrode to electrically contact portions of the second electrode. Forming at least one material layer includes forming at least one semiconductor or dielectric layer.

In another general aspect, a method includes fabricating an electronic device on a substrate using a photolithography process. Boundaries of components of the electronic device are defined by positioning a photo mask at a position relative to the substrate, and shifting an alignment of the photo mask according to a sequence of steps when defining boundaries of different components, in which the smallest distance of shift during the sequence of steps is smaller than a smallest line width of the electronic device.

Implementations of the method can have one or more of the following features. The electronic device can include a memory device having a plurality of memory cells. Each memory cell can include two or more sub-cells. The method includes forming layers of materials as the photo mask is shifted according to the sequence of steps to form material layers that are offset from one another to form components having different layers or different combinations of layers.

In another general aspect, a lithography system includes a wafer stage to support a wafer, a photo mask stage to support a photo mask, at least one stepper motor to drive the photo mask stage, and a programmable controller to control the at least one stepper motor to move the photo mask stage according to a sequence of steps to fabricate sub-cells of memory cells on the wafer, each of some of the steps involving a movement of the photo mask stage for a distance less than the smallest line width of the photo mask such that the sub-cells have dimensions smaller than the smallest line width of the photo mask. A storage stores instructions that when executed cause the programmable controller to control the at least one stepper motor to move the photo mask stage according to the sequence of steps to fabricate memory cells each having a plurality of sub-cells.

Implementations of the system can have one or more of the following features. The instructions when executed cause the programmable controller to control the at least one stepper motor to move the photo mask stage to position the photo mask at various locations to cause a first material layer to be formed at a position that is offset a distance relative to a position of a second material layer, forming a first sub-cell that includes the first material layer but not the second material layer, and a second sub-cell that includes both the first and second material layers, the offset distance being less than the smallest line width of the photo mask.

In another general aspect, an apparatus includes means for defining boundaries of sub-cells of memory cells of a memory device by positioning a photo mask at a position relative to a substrate on which the memory device is fabricated, and means for shifting alignment of the photo mask according to a sequence of steps in which the smallest distance of shift during the sequence of steps is smaller than a smallest width of the memory cell.

In another general aspect, a memory device includes memory cells each including a recordable layer between two metal layers. Each memory cell is constructed and designed to change from a first state to a second state upon application of an initialization signal, and change from the second state to a third state upon application of a write signal. For a voltage within a specified range that is applied across the two metal layers, the memory cell has a lower resistance in the first state than in the second state, and has a higher resistance in the second state than in the third state.

Implementations of the memory device can have one or more of the following features. Substantially all of the memory cells are initialized by applying the initialization signal to the memory cells to cause the memory cells to enter the second state. Information is recorded in the memory cells based on contrasts of the second state and the third state in the memory cells. In the first state, the memory cell has a resistor-like current-voltage characteristic for voltages within a predetermined range. In the second state, the memory cell has a diode-like current-voltage characteristic. In the third state, the memory cell has a resistor-like current-voltage characteristic for voltages within a predetermined range. The memory cell has a lower resistance in the third state than in the first state. The recordable layer includes at least one of a semiconductor or a dielectric material, e.g., silicon, germanium, SiGe, SiC, or diamond. The recordable layer has a thickness less than 50 nm. The specified range is from −1V to 1V. The initialization signal includes a pulse having a voltage less than 3V. The write signal includes a pulse having a voltage greater than 2V. In the first state, the recordable layer has openings that allow portions of the first metal layer to contact the second metal layer. Upon application of the initialization signal, the portions of the first metal layer that contact the second metal layer form an alloy with the material of the recordable layer. In the second state, a Schottky-like barrier is formed between the alloy and at least one of the first and second metal layers. The first and second metal layers include at least one of aluminum, gold, silver, titanium, copper, and aluminum alloys. The memory device includes circuitry for outputting a signal indicating whether a selected one of the memory cells is in the second state or the third state.

In another general aspect, a memory device includes a plurality of memory cells each including a recordable layer between two metal layers. Each memory cell is constructed and designed to change from an as-deposited state to an initialized state upon application of an initialization signal, and change from the initialized state to an inscribed state upon application of a write signal. The memory cell has a resistor-like current-voltage (I-V) characteristic when in the as-deposited state, a diode-like I-V characteristic when in the initialized state, and a resistor-like I-V characteristic when in the inscribed state for voltages within a predetermined range.

Implementations of the memory device can have one or more of the following features. When a read signal having a voltage between −1.8V to 1.8V is applied across the two metal layers to measure the resistance of a memory cell, the memory cell has a lower resistance in the as-deposited state than in the initialized state, and has a higher resistance in the initialized state than in the inscribed state. The initialization signal has a voltage level between two times a voltage level of a read signal and 75% of a voltage level of the write signal. When the memory cell is in the inscribed state, the memory cell has a resistor-like I-V characteristic for voltages below a first predetermined value, and has a diode-like I-V characteristic for voltages above a second predetermined value. Information is recorded in the memory cells based on contrasts of the initialized state and the inscribed state in the memory cells. A resistance of the memory cell relative to a reference value is indicative of information recorded in the memory cell.

In another general aspect, a memory device includes a plurality of memory cells each including a recordable layer between two metal layers, the recordable layer including a material different from that of the two metal layers, the recordable layer defining openings that allow portions of the first metal layer to contact the second metal layer, the recordable layer having a thickness less than 50 nm.

Implementations of the memory device can have one or more of the following features. Each memory cell is constructed and designed to change from a first state to a second state upon application of an initialization signal, and change from the second state to a third state or from the second state to a fourth state upon application of a first write signal or a second write signal, respectively. In the first state, the memory cell has a resistor-like current-voltage characteristic for voltages within a predetermined range. In the second state, the memory cell has a diode-like current-voltage characteristic. In the third and fourth states, the memory cell has resistor-like current-voltage characteristics for voltages within a predetermined range. The memory cell has a lower resistance in the first state than in the second state. The recordable layer includes at least one of a semiconductor or a dielectric material. The recordable layer includes islands of a material.

In another general aspect, a method includes initializing memory cells of a memory device by applying an initialization signal to each of the memory cells to cause the memory cell to change from an as-deposited state to an initialized state, the memory cells in the initialized state being capable of changing to an inscribed state upon receiving a write signal. Each of the memory cells has a resistor-like current-voltage (I-V) characteristic when in the as-deposited state, a diode-like I-V characteristic when in the initialized state, and a resistor-like I-V characteristic when in the inscribed state for voltages within a predetermined range.

Implementations of the method can have one or more of the following features. The method includes applying the write signal to some of the memory cells to cause the memory cells to change to the inscribed state.

In another general aspect, a method includes initializing memory cells of a memory device by applying an initialization signal to each of the memory cells to cause the memory cell to change from a first state to a second state, the memory cells in the second state being capable of changing to a third state upon receiving a write signal. For a voltage within a specified range that is applied to the memory cell, the memory cell has a lower resistance in the first state than in the second state, and has a higher resistance in the second state than in the third state.

Implementations of the method can have one or more of the following features. The method includes recording information in the memory cells by generating contrasts between the second and third states in the memory cells. In the first state, each of the memory cells includes a recordable layer positioned between a first metal layer and a second metal layer, and the recordable layer has openings that allow portions of the first metal layer to contact the second metal layer. Initializing the memory cell includes causing the portions of the first metal layer that contact the second metal layer to form an alloy with the material in the recordable layer. The method includes testing whether each memory cell is functional. Testing whether the memory cell is functional includes determining whether the memory cell has a resistance higher than a specified value in the first state, and determining whether the memory cell has a resistance higher than a specified value in the second state.

In another general aspect, a method of fabricating a memory device includes depositing a layer of semiconductor or dielectric material on a first metal layer, the layer of semiconductor or dielectric material having a thickness less than 50 nm and having openings that expose the first metal layer, and depositing a second metal layer on the layer of semiconductor or dielectric material, a portion of the second metal layer contacting the first metal layer through the openings in the layer of semiconductor or dielectric material.

Implementations of the method can have one or more of the following features. The method includes forming words lines and bit lines for selecting one of a plurality of memory cells each includes a corresponding different portion of the first metal layer, the second metal layer, and the layer of semiconductor or dielectric material. The method includes initializing the memory cells by applying an initialization signal to each of the memory cells to cause the memory cell to change from a first state to a second state, the memory cells in the second state being capable of changing to a third state upon receiving a write signal.

In another general aspect, a memory device includes a plurality of memory cells each including a recordable layer between two metal layers, the recordable layer including a first sub-cell and a second sub-cell. Each memory cell is constructed and designed to change from an as-deposited state to an initialized state upon application of an initialization signal, from the initialized state to a first inscribed state upon application of a first write signal, and from the initialized state to a second inscribed state upon application of a second write signal. The memory cell has a resistor-like current-voltage (I-V) characteristic when in the as-deposited state, a diode-like I-V characteristic when in the initialized state, and resistor-like I-V characteristics when in the first and second inscribed states for voltages within a predetermined range.

Implementations of the memory device can have one or more of the following features. The first sub-cell has a thickness that is different from the thickness of the second sub-cell. The first sub-cell has a first number of layer(s) of material(s) that is different from a second number of layer(s) of material(s) in the second sub-cell. The first sub-cell includes a material that is different from a material in the second sub-cell. The first sub-cell has a morphology that is different from the morphology of the second sub-cell. The recordable layer includes at least one of a semiconductor or a dielectric material. For a voltage within a specified range that is applied across the two metal layers, the memory cell has a lower resistance in the as-deposited state than in the initialized state, a higher resistance in the initialized state than in the first inscribed state, and a higher resistance in the initialized state than in the second inscribed state.

In another general aspect, a memory device includes memory cells each including a recordable layer between two metal layers, the recordable layer includes at least a first sub-cell and a second sub-cell, in which each memory cell is constructed and designed to change from a first state to a second state upon application of an initialization signal, and from the second state to a third state or from the second state to a fourth state upon application of a first write signal or a second write signal, respectively. For a voltage within a specified range that is applied across the two metal layers, the memory cell has a lower resistance in the first state than in the second state, a higher resistance in the second state than in the third state, and a higher resistance in the second state than in the fourth state.

Implementations of the memory device can have one or more of the following features. The first sub-cell has a thickness that is different from the thickness of the second sub-cell. The first sub-cell has a first number of layer(s) of material(s) that is different from a second number of layer(s) of material(s) in the second sub-cell. The first sub-cell includes a material that is different from another material in the second sub-cell. The first sub-cell and second sub-cells have different morphologies. The recordable layer includes at least one of a semiconductor or a dielectric material. Substantially all of the memory cells are initialized by applying the initialization signal to the memory cells to cause the memory cells to enter the second state. The first sub-cell is configured to be activated by the first write signal, and the second sub-cell is configured not to be activated by the first write signal. The first and second sub-cells are configured to be activated by the second write signal.

Ternary information is recorded in the memory cells based on contrasts between the second state, the third state, and the fourth state in the memory cells. Each memory cell is constructed and designed to change from the second state to a fifth state upon application of a third write signal. Quaternary information is recorded in the memory cells based on contrasts between the second state, the third state, the fourth state, and the fifth state in the memory cells. Each memory cell is constructed and designed to change from the second state to an i-th state upon application of a j-th write signal, i being any number from 5 to n+1, wherein n≧5 and j=i−2. N-nary information is recorded in the memory cells based on contrasts between the second to (n+1)-th states in the memory cells.

A resistance of a memory cell relative to reference values is indicative of information recorded in the memory cell. In the first state, the memory cell has a resistor-like current-voltage characteristic for voltages within a predetermined range. In the second state, the memory cell has a diode-like current-voltage characteristic. In the third and fourth states, the memory cell has resistor-like current-voltage characteristics for voltages within a predetermined range. The memory cell has a lower resistance in the third state than in the first state. The memory cell has a lower resistance in the fourth state than in the third state. The recordable layer has a thickness less than 50 nm. The specified range is from −1V to 1V. The initialization signal includes a pulse having a voltage less than 3V. The first and second write signals each includes a pulse having a voltage greater than 2V.

In the first state, at least one of the first and second sub-cells defines openings that allow portions of the first metal layer to electrically contact the second metal layer. Upon application of the initialization signal, portions of the first metal layer form an alloy with the material of the recordable layer. In the second state, a Schottky-like barrier is formed between the alloy and at least one of the first and second metal layers. The first and second metal layers include at least one of aluminum, gold, silver, titanium, copper, and aluminum alloys. The layer of semiconductor or dielectric material includes at least one of silicon, germanium, SiGe, SiC, and diamond. The memory device includes circuitry for outputting a signal indicating whether the memory cell is in the second state, the third state, or the fourth state.

In another general aspect, a memory device includes a plurality of memory cells each including a recordable layer positioned between two metal layers, the recordable layer including at least a first sub-cell and a second sub-cell, at least one of the sub-cells having openings that allow portions of the first metal layer to electrically contact the second metal layer, the recordable layer having a thickness less than 50 nm.

Implementations of the memory device can have one or more of the following features. Each memory cell is constructed and designed to change from a first state to a second state upon application of an initialization signal, change from the second state to a third state upon application of a first write signal, and change from the second state to a fourth state upon application of a second write signal, respectively. In the first state, the memory cell has a resistor-like current-voltage characteristic for voltages within a predetermined range. In the second state, the memory cell has a diode-like current-voltage characteristic. In the third and fourth states, the memory cell has resistor-like current-voltage characteristics for voltages within a predetermined range. The first sub-cell is configured to be activated by the first write signal, and the second sub-cell is configured not to be activated by the first write signal. The first and second sub-cells are configured to be activated by the second write signal.

In another general aspect, a method includes initializing memory cells of a memory device by applying an initialization signal to each of the memory cells to cause the memory cell to change from a first state to a second state, the memory cells in the second state being capable of changing to a third state upon receiving a first write signal, the memory cells in the second state being capable of changing to a fourth state upon receiving a second write signal. For a voltage within a specified range that is applied to the memory cell, the memory cell has a lower resistance in the first state than in the second state, has a higher resistance in the second state than in the third state, and has a higher resistance in the second state than in the fourth state.

Implementations of the method can have one or more of the following features. The method includes recording ternary information in the memory cells by generating contrasts between the second state, the third state, and the fourth state in the memory cells. The method includes activating the first sub-cell but not the second sub-cell by applying the first write signal. The method includes activating the second sub-cell by applying the second write signal. In the first state, the memory cell includes a recordable layer between a first metal layer and a second metal layer, the recordable layer has a first sub-cell and a second sub-cell, and at least one of the sub-cells has openings that allow portions of the first metal layer to electrically contact the second metal layer. Initializing the memory cell includes causing portions of the first metal layer to form an alloy with the material in the recordable layer. The method includes testing whether each memory cell is functional. Testing whether the memory cell is functional includes determining whether the memory cell has a resistance lower than a specified value in the first state, and determining whether the memory cell has a resistance higher than a specified value in the second state.

Aspects can have one or more of the following advantages. The recordable electric memory devices can be cost-effective (i.e., low cost-per-bit), user friendly, field programmable, require short lead time, and can satisfy a wide variety of applications, such as MP3 players, cellular phones, personal digital assistants, digital cameras, and camcorders, etc. The memory cells can be initialized to a stable state having predefined characteristics, so that it is easy to detect defective memory cells and avoid the use of the defective cells. A memory cell can have more than one inscribed state, so that multi-nary data can be stored in the memory cells. Each memory cell can have n sub-cells, in which the n sub-cells can be fabricated using the same photolithography mask by using a mask shifting technique. The n sub-cells can be fabricated using less than n alignment adjustment steps. Only a small amount of power is needed to write data to the recordable electrical memory device. The recordable electrical memory device can have a high density of memory cells, hence a higher storage capacity than many other types of memory devices (including flash memory) of the same physical size. Fabrication of the recordable electrical memory device uses less material, and also can use a simpler fabrication process, as compared to flash memory. The recordable electric memory can be fabricated using state of the art CMOS manufacturing process. Data is written in the recordable electrical memory device based on material change, and so the data will be less susceptible to electrical magnetic interference.

Other features and advantages of the invention will be apparent from the following description, and from the claims.

DESCRIPTION OF DRAWINGS

FIGS. 5A to 5E show a process of fabricating a memory cell having four distinct inscribed states by using photolithography alignment adjustment.

FIGS. 7A to 7F show a process for fabricating a memory cell having nine distinct inscribed states using photolithography alignment adjustment.

FIG. 8 shows a process for fabricating a memory cell that can store quaternary information.

FIGS. 11A to 11F show top views of layers of an NOR type recordable electrical memory device.

FIGS. 16A and 16B are graphs that show experimental data for a sample of a recordable electric memory that was configured to have one inscribed state.

DETAILED DESCRIPTION

1. Overview

Figure 1A:
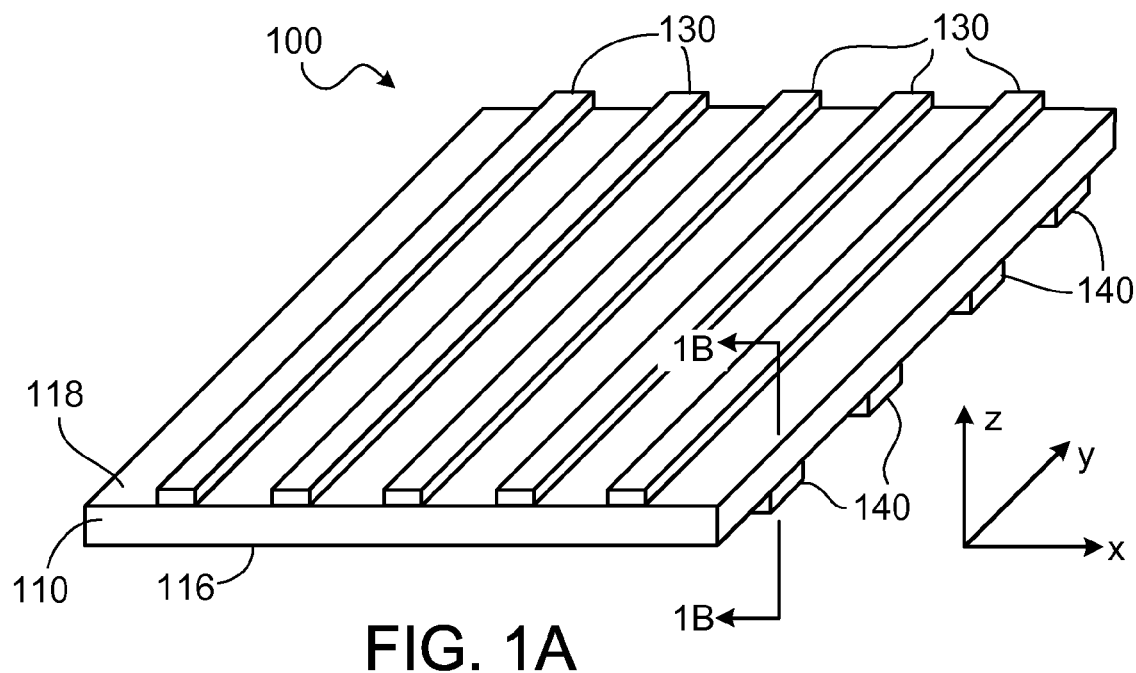
FIGS. 1A to 1C show a perspective view, a side view, and a top view, respectively, of a portion of a recordable electrical memory device.
Figure 1B:
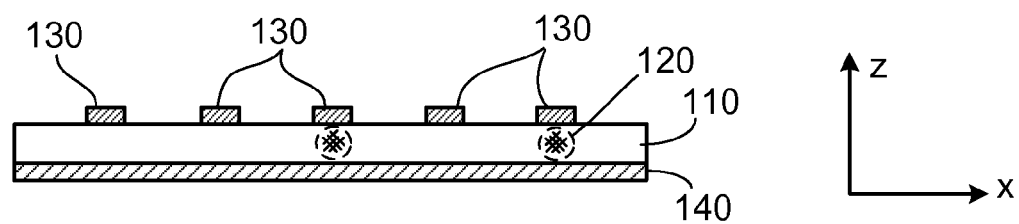
Figure 1C:
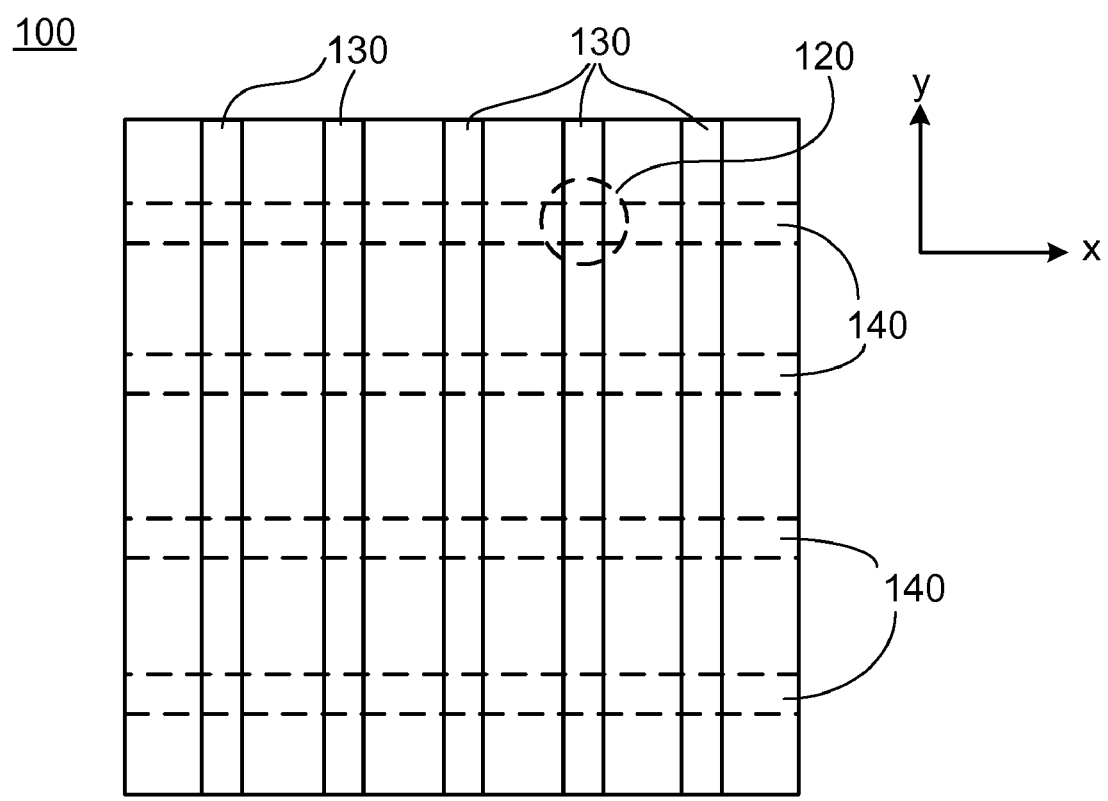

FIGS. 1A, 1B, and 1C show a perspective view, a side view, and a top view, respectively, of a portion of a recordable electrical memory device 100. The memory device 100 includes a recordable layer 110. A material property of the layer is modified upon application of an energy, thereby "writing" a mark to the layer. A material property of the layer (such as electrical resistance, resistivity) can be later detected using electrical methods (such as by applying an electrical read signal). Information is recorded in the memory device 100 based on contrast in the material property with respect to one or more reference values that can be detected, thereby "reading" from the layer to determine if a mark was previously written. For example, the resistance of a cell can be compared with one or more reference values to determine whether information is recorded in the region. The reference values can be, e.g., resistance values of reference cells. By using access circuitry that allows selective access to individual locations of the recordable layer 110, the memory device 100 can have multiple memory locations that can be individually modified and detected (i.e., written and read).

In this description, a change in a material property of a layer includes changes to the type(s), density (or densities), or arrangement(s) of atoms or molecules in the layer. A change in material property of a layer may be associated with a change in one or more electrical properties (such as resistivity and junction characteristics, such as a Schottky barrier or an ohmic junction) of the layer. A change in material property does not mean a change merely in the amount of electric charges accumulated at particular locations, such as accumulating charges in a capacitor or a floating gate.

In some examples, the access circuitry includes word lines 140 that are positioned on one side 116 of the recordable layer 110 and extend along an x-direction. Parallel word lines 140 are spaced apart along a y-direction. Bit lines 130 are positioned on another side 118 of the recordable layer 110 and extend along the y-direction. Parallel bit lines 130 are spaced apart along the x-direction. At each intersection of a word line 140 and a bit line 130 is a memory cell 120 that can be individually addressed. Information is recorded in the memory cell 120 by applying a write signal through a selected pair of a word line and a bit line, thereby changing a material property of a portion of the recordable layer 110 at the memory cell 120.

The word lines 140 and the bit lines 130 do not necessarily contact the memory cells 120 directly. The lines 130 and 140 may be electrically connected to the memory cells 120 through conducting layers or conducting lines.

The memory cells 120 do not necessarily have distinct boundaries. In some examples of the recordable electrical memory device 100, the recordable layer 110 may include one or more continuous layers of materials, so the term "memory cell" is used in general to include a portion of the recordable layer 110 that can be individually accessed, such as by a selected pair of word and bit lines.

A memory cell 120 may include electrodes that are connected to the word and bit lines, and may include other components. A memory cell can have one or more sub-cells. Each sub-cell can have one or more sub-layers, and different sub-cells can have different sub-layers or different combinations of sub-layers.

In some examples, the recordable layer 110 spans several memory cells 120, and conductive word and bit lines are electrically connected to the recordable layer 110. As described below, the recordable layer 110 can have an unwritten ("virgin" or "as-deposited"), an initialized state, and an inscribed state. The electrical property of the recordable layer 110 has characteristics such that (1) in the unwritten state, the majority of electric current can only pass through the memory cell defined by the word and bit lines, (2) the electric current that passes through the defined memory cell is small compared to any of the inscription states (this can be achieved by choosing process parameters so that the unwritten state has a higher resistance compared to the inscription states), and (3) the initialized state can have a higher resistance than the unwritten state.

Energy can be applied to the recordable layer 110 to change the resistance (electrical properties) of a region defined by the electrodes of the selected memory cell, for example, by applying an initialization signal or a write signal having a power level and/or duration sufficient to cause the modification in material property in the recordable layer 110. The initialization signal or write signal may include a single pulse, or a series of sub-pulses (or other suitable voltage or current driving signal).

As shown in FIG. 1B, when an initialization signal or a write signal is applied to a memory cell 120, the initialization signal or write signal may induce an electric current to flow through the memory cell 120 and generate thermal energy, which causes the modification of material property in the recordable layer 110, for example, by causing a chemical reaction in the cell, or causing different materials to intermix. The material change may be irreversible in that other signals cannot be applied to reverse the modification of the material property. Examples of the material properties that may change upon application of the write signal include resistivity and junction characteristics, such as a Schottky barrier or an ohmic junction, within the layer.

In this description, a memory cell 120 can have an as-deposited state, an initialized state, and one or more inscribed states. The term "as-deposited state" refers to a condition in which the layers of the recordable electrical memory device 100 have been deposited and before initialization of the memory cell 120, so that the recordable layer 110 maintains its "virgin" material and electrical properties. The term "initialized state" refers to a condition after an initialization signal has been applied and before a write signal has been applied to the memory cell 120. The initialization signal causes a change in a material property (as well as an electrical property) in the recordable layer 110. The initialized state is a stable state that has electrical characteristics that may be different from the as-deposited state and the inscribed state(s). The term "inscribed state" refers to a condition after the write signal has been applied so that another material change occurs in the recordable layer 110, resulting in further change in a material property (as well as an electrical property). The term "initialized mark" refers to a portion of the recordable layer 110 in the initialized state, and the term "recorded mark" refers to a portion of the recordable layer 110 in the inscribed state.

2. Memory Cells

The recordable layer 110 can be composed of various materials. Depending on the configuration for the memory cells 120, the memory cell 120 can have, for example, (1) an as-deposited state, an initialized state, and one inscribed state, or (2) an as-deposited state, an initialized state, and multiple inscribed states. In the first case, when a memory cell 120 is in the initialized state, applying a write signal causes the memory cell 120 to change to the inscribed state. Each memory cell can be used to record binary information. In the second case, when a memory cell 120 is in the initialized state, applying a write signal causes the memory cell 120 to change to one of multiple inscribed states. Each memory cell can be used to record, e.g., ternary, quaternary, or n-nary information.

2.1 Initialization and Inscription of Memory Cells

The initialization and inscription of memory cells are described below. Memory cells 120 that have an as-deposited state, an initialized state, and one or more inscribed states can be fabricated using layers that perform a first material change upon application of an initialization signal, and perform additional material change(s) upon application of a write signal.

Figure 2A:
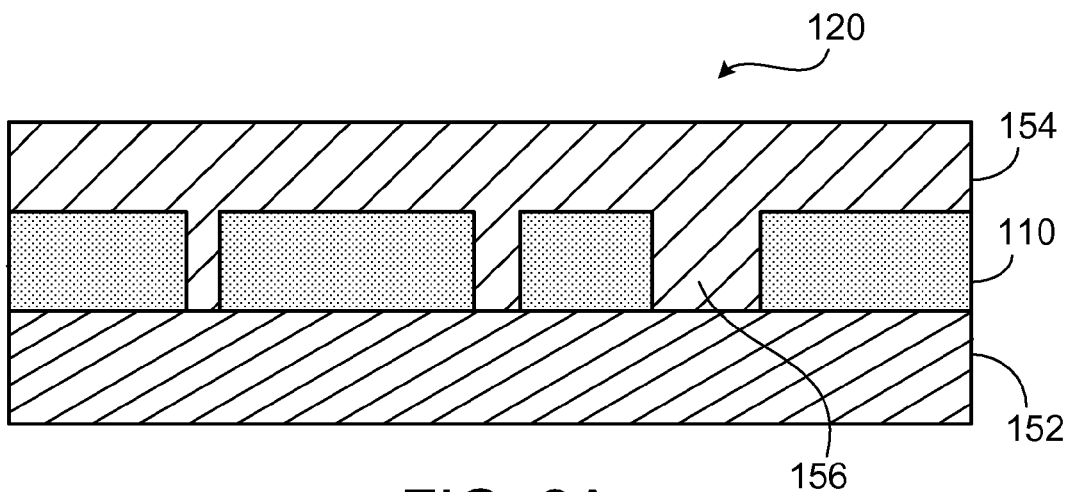
FIGS. 2A to 2C are diagrams of a memory cell including a recordable layer that has openings or islands of a material.

Referring to FIG. 2A, in some examples, a memory cell 120 includes a thin recordable layer 110 positioned between a first (lower) metal electrode 152 and a second (upper) metal electrode 154. The first and second electrodes 152 and 154 can be made of, for example, aluminum. The recordable layer 110 can be made of a semiconductor material, e.g., silicon, germanium, SiGe, and SiC. The semiconductor material can be either n-type or p-type, and can be doped with impurities. The recordable layer 110 can also be made of a dielectric material, e.g., diamond. The recordable layer 110 can have a thickness (or an effective thickness), e.g., less than 100, 50, 25, 10, 5, 3, or 1 nm. The first electrode 152 and the second electrode 154 can be electrically connected to, e.g., the word line 140 and the bit line 130, respectively. The first and second metal electrodes 152 and 154 each can be made of, e.g., aluminum, gold, silver, titanium, copper, or alloys of the above metals, and can have a thickness, e.g., greater than 50 nm.

In some examples, the recordable layer 110 has openings 156 to allow the first metal electrode 152 to contact the second metal electrode 154. The openings 156 have areas that are small, so that the recordable layer 110 is not entirely conductive. The memory cell 100 has resistor-like current-voltage (I-V) characteristics. The resistor-like current-voltage characteristics can include, for example, a current-voltage relationship that is substantially linear. The resistance of the memory cell 120 in the as-deposited state can be, e.g., in the order of gigaohms when the memory cell has an area of 1 $\mu m^2$.

Figure 2B:
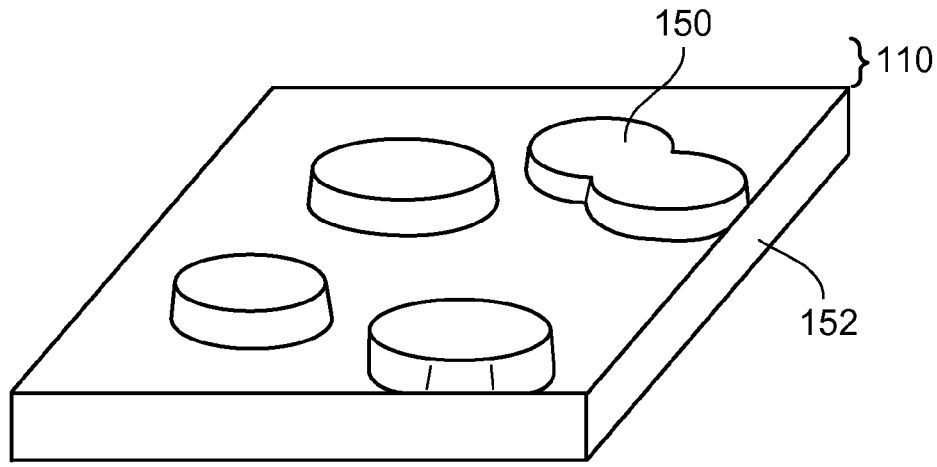

The recordable layer 110 can be fabricated by depositing discontinuous regions or islands 150 of one or more semiconductor or dielectric materials on the first metal electrode 152, as shown in FIG. 2B. The islands of materials 150 have an "effective thickness," which is defined as the volume of the material divided by the sum of the area covered by the material and the area in between the material. The diameters of the islands 150 can be made smaller than the width of the word and bit lines 140 and 130. For example, when 130 nm semiconductor fabrication process is used, the width of the word and bit lines can be 130 nm, and the diameter of the islands 150 can be made to be about 10 nm. Because each word line and bit line covers several islands of materials 150, the islands 150 appear to the word and bit lines as a continuous layer having the effective thickness.

Islands of materials 150 can be formed by using techniques that can include, without limitation, physical vapor deposition, chemical vapor deposition, plasma enhanced chemical vapor deposition, metal organic chemical vapor deposition, or molecular beam epitaxy, with a low operating power or a short operating duration than that used for forming the first and second metal electrodes 152, 154.

The islands 150 can have more than one type of semiconductor or dielectric material. For example, a first layer of islands of a first type of material is deposited, followed by deposition of a second layer of islands of a second type of material.

Figure 2C:
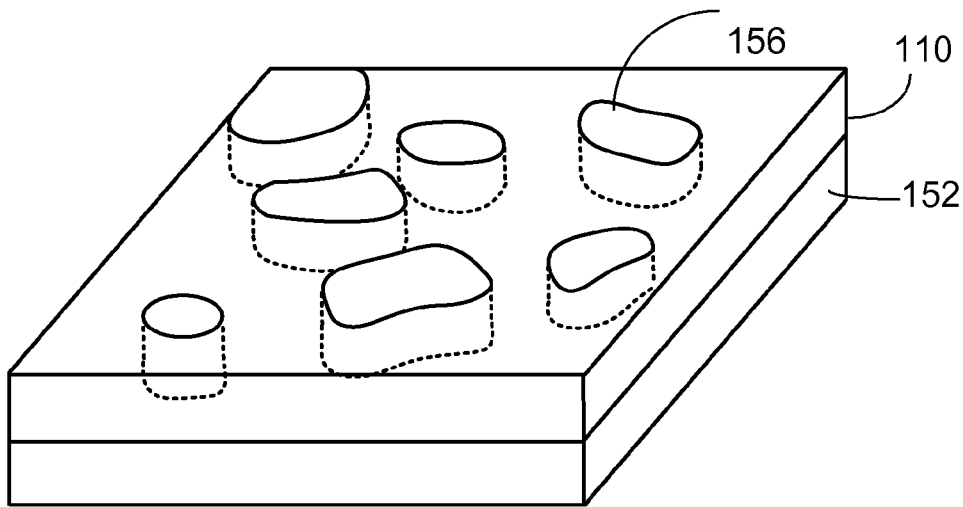

In some examples, the islands 150 may have different sizes, and some islands 150 may be connected. In some examples, as the material that is deposited increases, many of the islands 150 become connected, resulting in a continuous layer of material having spaces 156 (or holes) distributed across the layer, as shown in FIG. 2C, such that the layer of material does not completely cover or overlap the other layers (e.g., 152).

The as-deposited state can be designed to have either a higher resistance or a lower resistance than at least one of the stable inscribed states. In the examples described below, it is assumed that the as-deposited state has a higher resistance than all the inscribed states. For example, the memory cell 120 can be processed such that a small sub-cell includes a recordable layer 110 having openings 156 or islands of material 150, and the contact between the first and second electrodes 152 and 154 is limited to the small sub-cell, so that the as-deposited state has a higher resistance than the inscribed state(s). The small sub-cell can be used for "initialization", in which the sub-cell becomes semi-conducting after initialization, generating a Schottky barrier after initialization.

After the layer 110 of semiconductor or dielectric material is deposited on the first metal electrode 152, the second metal electrode 154 is deposited on the recordable layer 110, filling in the spaces 156 and contacting the first metal electrode 152. As a result of the contacts between the first and second metal electrodes 152, 154, the memory cells 120 have resistor-like current-voltage characteristics in the as-deposited state.

After the memory device 100 has been fabricated, upon application of an initialization signal (which can be, e.g., less than 3V), due to thermal energy induced by the current during initialization, portions of the first metal electrode 152 in the openings 156 (and in some cases, portions of the second metal electrode 154 contacting the first metal electrode 152) form an alloy with the semiconductor or dielectric material in the layer 110 and become a layer of alloy material. The materials for the semiconductor or dielectric in layer 110, the first metal electrode 152, and the second metal electrode 154 are selected such that a Schottky-like barrier is formed between the alloy and at least one of the first and second metal electrodes 152, 154. As a result, the memory cell 120 has diode-like current-voltage characteristics in the initialized state.

In some examples, the initialization signal can be design to be not less than twice the designed reading voltage and not more than 75% of the designed inscription voltage. For example, the initialization signal can have a range between about 0.6 V to 2 V.

The diode-like current-voltage characteristics can include, for example, a non-linear current-voltage relationship, where the slope of the current-voltage curve is small when the voltage is below a threshold voltage, and the slope increases significantly when the voltage is larger than the threshold voltage. Due to the Schottky-like barrier(s), the memory cell 120 does not conduct current (except for a small leakage current) when a small voltage is applied to bias the memory cell 120. Current starts to flow when the forward-bias voltage increases above a threshold voltage $V_T$.

As discussed above, a memory cell 120 can have a first sub-cell that has a recordable layer 110 with openings (or islands of material), and other sub-cells having a recordable layer 110 without opening (or islands of material). The first sub-cell upon application of the initialization signal forms an alloy so that the first sub-cell has a diode-like I-V characteristics. The other sub-cells do not change upon application of the initialization signal.

Figures 7E, 7F:
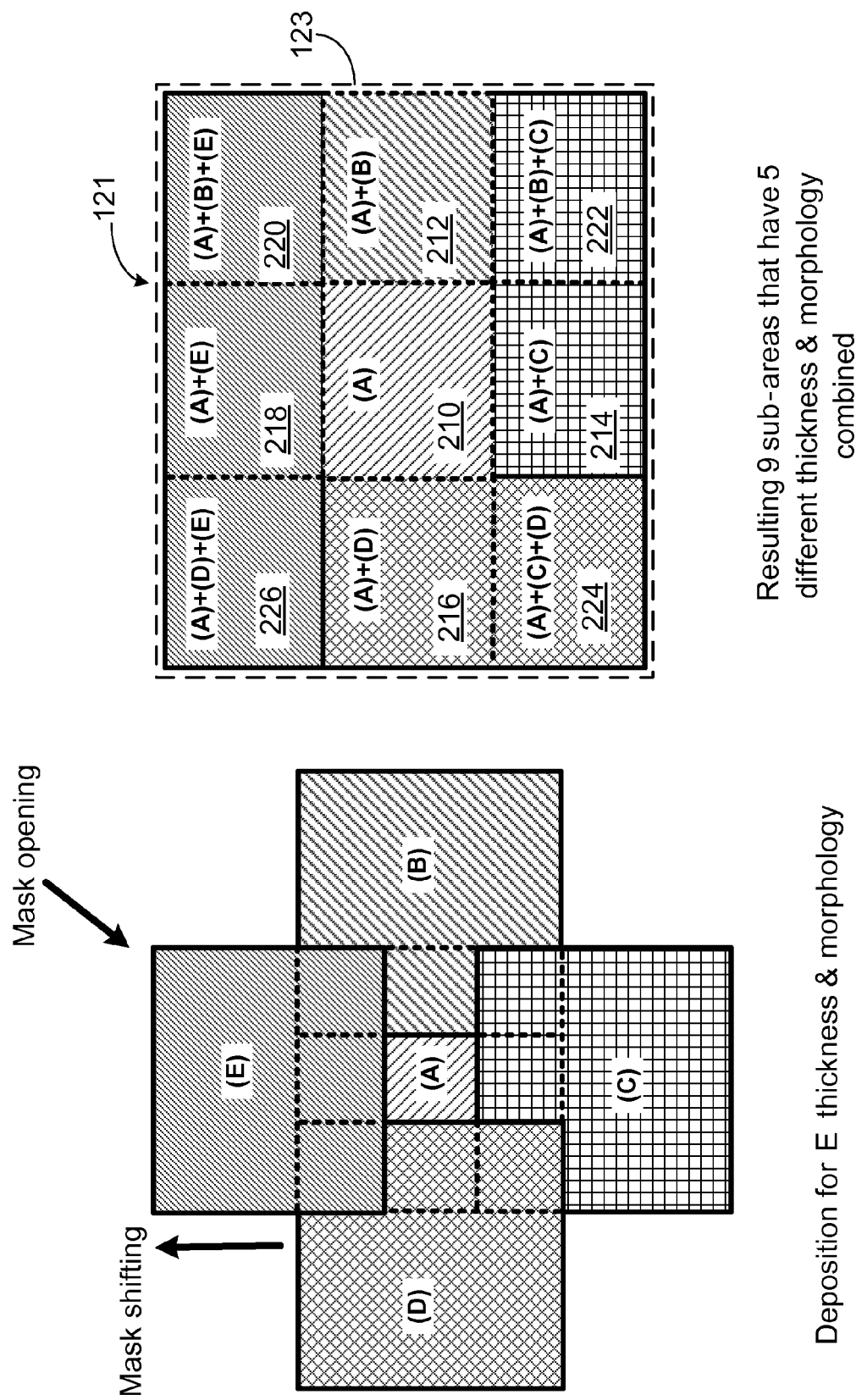

In some implementations, a memory cell 120 can have a recordable layer having multiple sub-layers (for example, see FIGS. 5E, 7F, and 8). A first sub-cell can have one or more sub-layers with openings or islands of material such that portions of the lower electrode electrically contact portions of the upper electrode through the openings in the recordable layer of the first sub-cell. Other sub-cells has at least a sub-layer without openings so that the lower electrode does not electrically contact the upper electrode through the other sub-cells. Upon application of the initialization signal, the first sub-cell forms an alloy so that the first sub-cell has a diode-like I-V characteristics. The other sub-cells do not change upon application of the initialization signal.

Upon application of a write signal (which can be, e.g., more than 2V), due to thermal energy induced by the current during application of the write signal, the sub-cells having a recordable layer 110 without openings can react irreversibly to form an ohmic-like junction. The sub-cell having an alloy material generated during the initialization stage can further fuse with the first and second metal electrodes 152, 154 such that the interfaces between the layer 150 and the metal layers 152, 154 behave similar to ohmic junctions. Thus, after application of the write signal, the memory cell 120 behaves like a resistor.

Because the recordable layer 110 is thin, a small amount of energy is used to record data to the memory cells 120, so data can be written into the memory cells 120 at a fast speed. Different memory devices 100 can have different writing pulse train strategies. In general, data can be written into the memory cells 120 using a writing signal having a voltage, e.g., less than 3.5 V within a few micro-seconds.

2.2 Initialize Memory Cells That Have One Inscribed State

Figure 3:
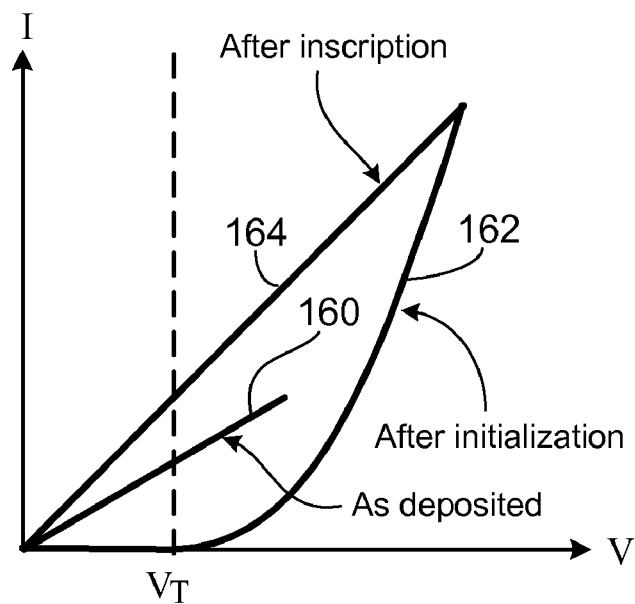
FIG. 3 show I-V curves of a memory cell that has one inscribed state.

FIG. 3 shows I-V curves of an example of a memory cell 120 that has one inscribed state. I-V curves 160, 162, and 164 represent the current versus voltage characteristics of the memory cell 120 in the as-deposited state, the initialized state, and the inscribed state, respectively. The memory cell 120 changes from the initialized state to the inscribed state upon application of a write signal that has a voltage level (or power level) above a predetermined threshold.

As indicated by the I-V curve 160, in the as-deposited state, the memory cell 120 has characteristics similar to a resistor. As indicated by the I-V curve 162, in the initialized state, the memory cell 120 has characteristics similar to a diode. When the forward bias voltage V is less than the threshold voltage $V_T$, the current I is negligible, or equal to a small leakage current that does not increase proportionally with respect to the applied voltage V. As indicated by the I-V curve 164, after application of a write signal, the memory cell 120 behaves like a resistor, in which the current is proportional to the applied voltage V, even for small voltages. In this example, the resistance of the memory cell 120 in the inscribed state is higher than the resistance of the memory cell in the as-deposited state.

By applying a read signal having a voltage V between 0 volt and $V_T$ to the memory cell 120, and sensing the current I that flows through the memory cell 120, one can determine whether the memory cell 120 has been initialized or inscribed. For example, a memory cell in the initialized state and the inscribed state may represent a data bit of "0" and "1," respectively.

The write signal may have a voltage level of, for example, 2 volts or higher, and the read signal may have a voltage level of, for example, less than 1V, such as 50 to 700 mV. Information can be carried in the memory device 100 by generating contrasts in the currents among different states of the memory cells 120. In some examples, the amount of contrast in the currents between the as-deposited state and the initialized state can be greater than 10, i.e., I1/I2≧10, where I1 represents the current in the as-deposited state and I2 represents the current in the initialized state for a given voltage.

When designing the memory cell 120, the type(s) of semiconductor or dielectric material(s) used for the recordable layer 110, the doping level (if doping is used) of the semiconductor material, and the type(s) of metal used for the electrodes 152 and 154 are selected such that the memory cell 120 has a particular resistor-like characteristic in the as-deposited state, a particular diode-like characteristic in the initialized state, and a particular resistor-like characteristic in the inscribed state, thereby producing a desired contrast between the as-deposited state, the initialized state, and the inscribed state.

2.3. Memory Cells That Have Multiple Inscribed States

A memory cell 120 can be configured to have multiple inscribed states by dividing the memory cell into multiple sub-cells, different sub-cells having different thresholds for the write signal. When the write signal is above a first threshold, a material change occurs at a first sub-cell. When the write signal is above a second threshold, a material change occurs at the first sub-cell and a second sub-cell, and so forth. The material changes at different regions or at different combinations of regions result in measurable differences in the inscribed states.

Figure 4:
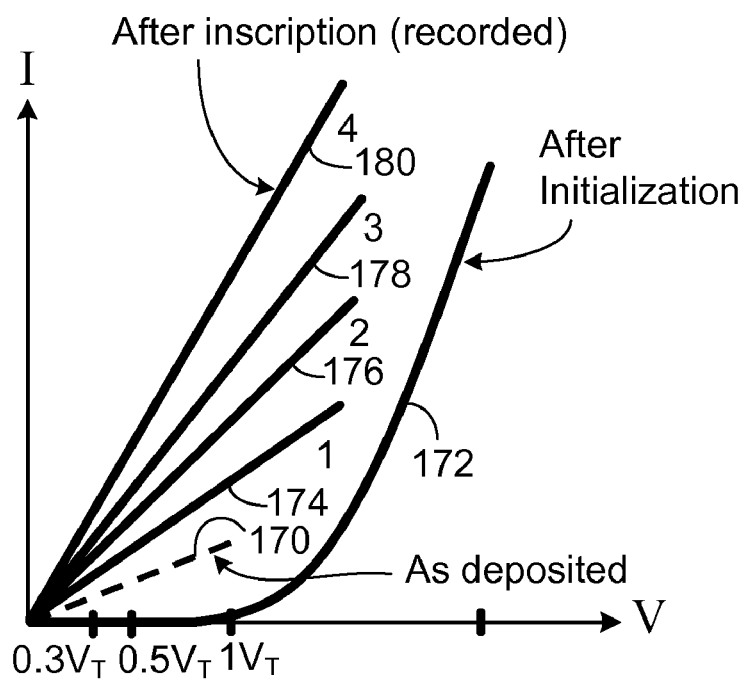
FIG. 4 shows I-V curves of a memory cell that has four inscribed states.

FIG. 4 shows I-V curves of an example of a memory cell 120 that has four inscribed states. I-V curves 170, 172, 174, 176, 178, and 180 represent the current versus voltage characteristics of the memory cell 120 in the as-deposited state, the initialized state, the first inscribed state, the second inscribed state, the third inscribed state, and the fourth inscribed state, respectively. As indicated by the I-V curve 170, in the as-deposited state, the memory cell 120 has characteristics similar to a resistor. As indicated by the I-V curve 172, in the initialized state, the memory cell 120 has characteristics similar to a diode.

The memory cell 120 can be designed to enter the first, second, third, and fourth inscribed states when the write signal has a voltage level between, e.g., 2 to 2.3 V, 2.5 to 2.7 V, 2.9 to 3.2 V, and 3.3 to 3.8 V, respectively. As indicated by the I-V curves 174, 176, 178, and 180, after application of a write signal that is within a first, second, third, and fourth range, the memory cell 120 behaves like a resistor having a first, second, third, and fourth resistance value, respectively. In this example, the resistances of the memory cell 120 in the inscribed states are lower than the resistance of the memory cell in the as-deposited state.

By applying a read signal having a voltage V between 0 volt and $V_T$ to the memory cell 120, and sensing the current I that flows through the memory cell 120, one can determine whether the memory cell 120 has been initialized or inscribed, and which inscribed state the memory cell 120 is in. For example, a memory cell in the initialized state may represent a data bit of "0," a memory cell in the first, second, third, and fourth inscribed states may represent a data bit of "1," "2,", "3," and "4," respectively.

FIGS. 5A to 5D show a process of fabricating a memory cell 120 having four distinct inscribed states by using the technique of a photolithography alignment. The four sub-cells of the memory cell 120 are fabricated using a single photolithography mask placed at three different positions.

Referring to FIG. 5A, a photolithography mask 190 having an opening 192 is positioned above a region A of the memory cell 120 (the boundary of the memory cell is not shown in FIGS. 5A to 5C). The mask 190 is positioned and aligned with a reference mark 193. The mask 190 is used to form a layer of material A defined by the opening 192 at the region A using a photolithography process. The layer of material A is formed above a lower electrode, and can have islands of materials or have openings to allow an upper electrode to contact the lower electrode through the openings. The material A can be a semiconductor or a dielectric.

Referring to FIG. 5B, the mask 190 is shifted in the Y direction relative to region A so that the opening 192 is positioned above a region B (a portion of the region B overlaps the region A). The mask 190 is used to form a layer of material B defined by the opening 192 at the region B using photolithography. A portion of the layer of material B overlaps the layer of material A. The material B can be a semiconductor or a dielectric, can have a composition and thickness that are similar or different to the material A.

Referring to FIG. 5C, the mask 190 is shifted in the X direction relative to region A so that the opening 192 is positioned above a region C. A portion of the region C overlaps the regions A and B. The mask 190 is used to form a layer of material C defined by the opening 192 at the region C using photolithography. A first portion of the layer of material C overlaps the layer of material A but not the layer of material B, and a second portion of the layer of material C overlaps both layers of materials A and B. The material C can be a semiconductor or a dielectric, and can have a composition and thickness that are similar or different to the materials A and B.

Referring to 5D, an upper electrode is formed above the region A. A region 195 where the upper and lower electrodes overlap (shown in dashed lines) defines the portion of the recordable layer 110 that undergoes reaction upon application of the initialization signal or the write signal. The memory cell 120 includes four distinct sub-cells: a first sub-cell 194 having material A, a second sub-cell 196 having materials A+B, a third sub-cell 198 having materials A+C, and a fourth sub-cell 200 having materials A+B+C. Portions of the upper electrode contact the lower electrode through openings in the material A in the first sub-cell 194. The additional materials B and C not directly between the electrodes (i.e., outside of the dashed lines in FIG. 5D) do not have significant effect on the operation of the memory cell 120.

In some implementations, the distance between a first position of the photo mask 190 for forming the layer of material A and a second position of the photo mask 190 for forming the layer of material B is less than a smallest line width of the photo mask. For example, the photo mask 190 may be designed to use with a lithography system that can resolve a smallest line width w. By shifting alignment of the photo mask 190, features of the memory cell 120 having dimensions less than w can be achieved.

FIG. 5E is a perspective view of the memory cell 120 with material layers A, B, and C above the lower electrode 152 (the upper electrode is not shown).

In FIGS. 5A to 5C, only one opening 192 is shown in the mask 190. The mask 190 can also have multiple openings 192 so that multiple memory cells 120 are fabricated at the same time.

When the memory cell 120 is in the as-deposited state, because of contacts between the upper and lower electrodes through the openings in the material A in the first sub-cell 194, the memory cell 120 has resistor-like current-voltage characteristics similar to the I-V curve 170 of FIG. 4. The second, third, and fourth sub-cells 196, 198, and 200, which have continuous layers of semiconductor or dielectric materials, have significantly higher impedances than the first sub-cell 194.

When an initialization signal is applied to the memory cell 120, the initialization signal causes portions of the electrodes to form an alloy with the material A in the first sub-cell 194. The interface(s) between the alloy and the lower and/or upper electrodes has a Schottky-like barrier, causing the memory cell to have diode-like current-voltage characteristics, similar to the I-V curve 172 in FIG. 4. The initialization signal is not sufficient to cause material changes in the second, third, or fourth sub-cells 196, 198, and 200.

When a first write signal having a first pulse waveform (which is different from the initialization signal) is applied to the memory cell 120 in the initialized state, the write signal causes a further material change in the first sub-cell 194 so that the first sub-cell 194 has resistor-like current-voltage characteristics. The memory cell 120 enters the first inscribed state, and has resistor-like current-voltage characteristics similar to the I-V curve 174 of FIG. 4.

When a second write signal having a second pulse waveform is applied to the memory cell 120 in the initialized state, the write signal causes a material change in one of the sub-cells (e.g., the second sub-cell 196), so that the first and second sub-cells 194 and 196 have resistor-like current-voltage characteristics. The memory cell 120 enters the second inscribed state, and has resistor-like current-voltage characteristics similar to the I-V curve 176 of FIG. 4.

Figure 6A:
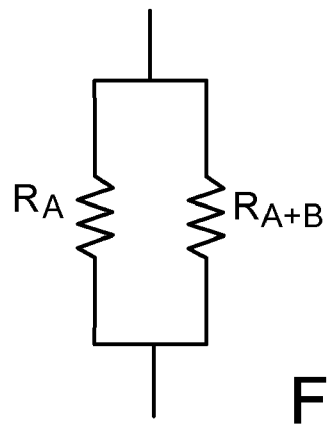
FIGS. 6A to 6C are diagrams of equivalent circuits of memory cells.

An equivalent circuit of the memory cell 120 in the second inscribed state is shown in FIG. 6A. The first and second sub-cells 194 and 196 are connected in parallel, and are represented by resistors $R_A$ and $R_{A+B}$, respectively, that are connected in parallel. The resistance of the memory cell 120 in the second inscribed state is less than the resistance of the cell in the first inscribed state.

When a write signal having a third pulse waveform is applied to the memory cell 120 in the initialized state, the write signal causes material changes in, e.g., the second and third sub-cells 196 and 198 so that the first to third sub-cells 194 to 198 have resistor-like current-voltage characteristics. The memory cell 120 enters the third inscribed state, and has resistor-like current-voltage characteristics similar to the I-V curve 178 of FIG. 4.

Figure 6B:
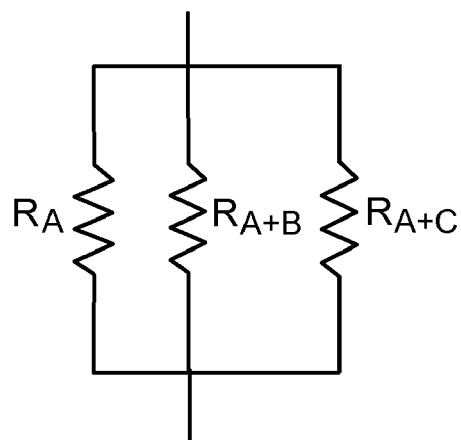

An equivalent circuit of the memory cell 120 in the third inscribed state is shown in FIG. 6B. The first, second, and third sub-cells 194, 196, and 198 are represented by resistors $R_A$, $R_{A+B}$, and $R_{A+C}$, respectively, that are connected in parallel.

When a write signal having a fourth pulse waveform is applied to the memory cell 120 in the initialized state, the write signal causes material changes in, e.g., the second, third, and fourth sub-cells 196, 198, and 200 so that the first to fourth sub-cells 194, 196, 198, and 200 have resistor-like current-voltage characteristics. The memory cell 120 enters the fourth inscribed state, and has resistor-like current-voltage characteristics similar to the I-V curve 180 of FIG. 4.

Figure 6C:
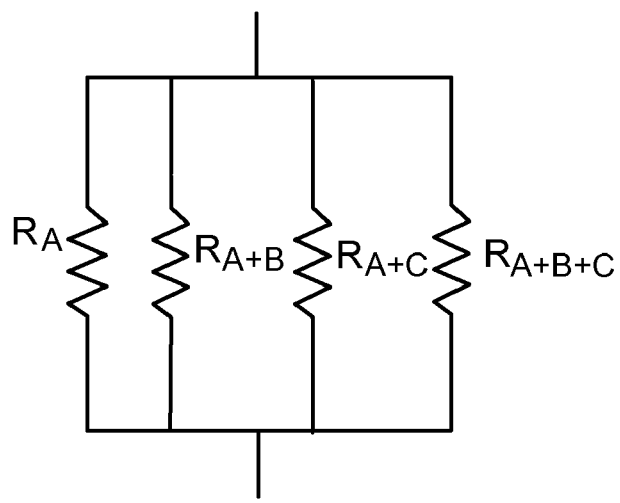

An equivalent circuit of the memory cell 120 in the fourth inscribed state is shown in FIG. 6C. The first, second, third, and fourth sub-cells 194, 196, 198, and 200 are represented by resistors $R_A$, $R_{A+B}$, $R_{A-C}$, and $R_{A+B+C}$, respectively, that are connected in parallel.

Examples of material changes of thin layers of materials are described in co-pending U.S. patent application Ser. No. 11/503,671, titled "Electrical Thin Film Memory," filed Aug. 14, 2006, herein incorporated by reference. For example, when a write signal is applied to a memory cell 120, a current flows from the bit line 130 through the memory cell 120 to the word line 140 (or vice versa), and the electric field generated across the memory cell 120 can induce stress, sometimes causing "material break down." The electric current dissipates thermal energy into the recordable layer 110 that is proportional to $I^2R$, where I represents the electric current and R represents the resistance of the memory cell 120. The thermal energy causes the recordable layer 110 to irreversibly change from the as-deposited state to the initialized state, or from the initialized state to one of the inscribed states.

FIGS. 7A to 7F show a process of fabricating a memory cell 121 having nine distinct inscribed states by using the photolithography alignment adjustment technique. The nine sub-cells of the memory cell 121 are fabricated using a single photolithography mask 190 placed at five different positions. The photomask 190 has an opening 192, similar to the photomask used in FIGS. 5A to 5D. In FIGS. 7A to 7F, the boundary of the opening 192 is shown, and the photomask 190 is not shown.

Referring to FIG. 7A, a layer of material A is formed above a lower electrode at a region A. The layer of material A can have islands of materials with spacing between the islands or have openings to allow an upper electrode to contact the lower electrode. The material A can be a semiconductor or a dielectric.

Referring to FIGS. 7B to 7E, the photolithography alignment is shifted sequentially to regions B, C, D, and E to form layers of materials B, C, D, and E. Each of the layers of materials B, C, D, and E can be a semiconductor or a dielectric, and can have a composition and thickness that are similar or different from the other layers. As shown in FIG. 7B, a portion of the layer of material B overlaps a portion of the layer of material A. As shown in FIG. 7C, portions of the layer of material C overlap portions of one or both layers of materials A and B. As shown in FIG. 7D, portions of the layer of material D overlap portions of one or both layers of materials A and C. As shown in FIG. 7E, portions of the layer of material E overlap portions of one or more of layers of materials A, B, and D.

Referring to 7F, an upper electrode is formed above the region A (the entire region A is shown in FIG. 7A). A region 123 where the upper and lower electrodes overlap (shown in dashed lines) defines the portion of the recordable layer 110 that undergoes reaction upon application of the initialization signal or the write signals. The region covers nine distinct sub-cells: a first sub-cell 210 having material A, a second sub-cell 212 having materials A+B, a third sub-cell 214 having materials A+C, a fourth sub-cell 216 having materials A+D, a fifth sub-cell 218 having materials A+E, a sixth sub-cell 220 having materials A+B+E, a seventh sub-cell 222 having materials A+B+C, an eighth sub-cell 224 having materials A+C+D, and a ninth sub-cell having materials A+D+E.

The memory cell 121 of FIG. 7F having nine different sub-cells can have nine distinct inscribed states, and can store 9-nary data. Data is written to the memory cell 121 by using a write signal having a voltage level and/or pulse numbers as well as pulse durations that are selected among 9 different ranges or 9 different pulse waveforms.

Initialization of the memory cell 121 is similar to the initialization of the memory cell 120 (FIG. 5D). Writing data to the 9 sub-cells of the memory cell 121 is also similar to writing data to the 4 sub-cells of the memory cell 120, except that more write levels can be used to achieve more inscribed states.

FIG. 8 shows an example of a process 230 for fabricating a memory cell 125 that can store quaternary information. A lower electrode 152 is formed on a substrate. A first layer of material is sputtered 246 onto the lower electrode 152. A mask is positioned so that a dark pattern 237 on the mask is at a first position 232 such that a portion of the first layer of material is masked by the dark pattern 237. An etching process 248 etches away portions of the first layer of material not masked by the dark pattern 237, resulting in a first layer of material 234 remaining on the lower electrode 152. A portion (not shown in the figure) of the first layer of material 234 that is not located between the lower electrode 152 and an upper electrode does not significantly affect the operation of the memory cell 125.

A second layer of material 238 is formed after a second sputtering step 250, a masking step 259, and a second etching step 252. The alignment adjustment is shifted so that the dark pattern 237 is at a second position 236 to mask a portion of the second layer of material 238 that is not etched. Similarly, a third layer of material 242 is formed after a third sputtering step 254, a masking step 260, and a third etching step 256. A fourth layer of material 244 is formed after a fourth sputtering step 258. The fourth layer of material 244 covers the entire area above the lower electrode 152. An upper electrode is deposited on the fourth layer of material 244.

The memory cell 125 in FIG. 8 has four distinct sub-cells: a first sub-cell 260 that includes the fourth layer of material 244, a second sub-cell 262 that includes the third and fourth layers of materials 242 and 244, a third sub-cell 264 that includes the second, third, and fourth layers of materials 238, 242, and 244, and a fourth sub-cell 266 that includes the first, second, third, and fourth layers of materials 234, 238, 242, and 244.

The fourth layer of material 244 can include islands of materials with spacing between the islands, or a layer of material having openings, so that portions of the upper electrode contacts the lower electrode through the openings in the fourth layer of material 244.

2.4. Integrated Recordable Electrical Memory Device

Figure 9:
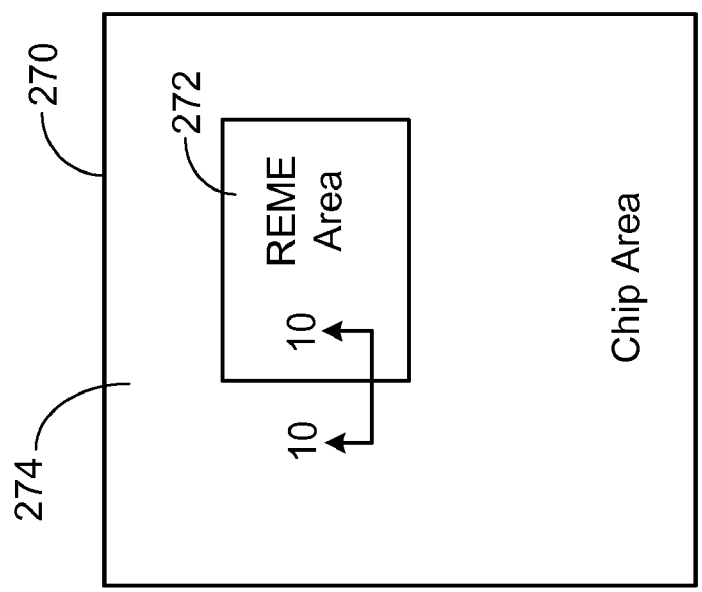
FIG. 9 shows a chip that includes a recordable electrical memory area for fabricating a recordable electrical memory device.

FIG. 9 shows an example of a chip 270 that includes a Recordable Electrical MEmory (REME) area 272 for fabricating the recordable electrical memory device 100. The device 100 includes word lines, bit lines, and the recordable layer, but does not necessarily include active devices, such as transistors. The active devices for selecting the word lines and bit lines are fabricated in an area 274 outside of the REME area 272.

The area 274 may include other circuitry, such as a central processing unit or a microcontroller. The chip 270, including the electrical thin film memory device 100 and other modules, can be fabricated using a process that is similar to the standard 1-poly, 2-metal semiconductor process, which is capable of fabricating devices having a poly-silicon layer, a first metal layer, a second metal layer, and a nitride layer. A photo mask is used to pattern each layer to achieve the desired geometry.

Figure 10:
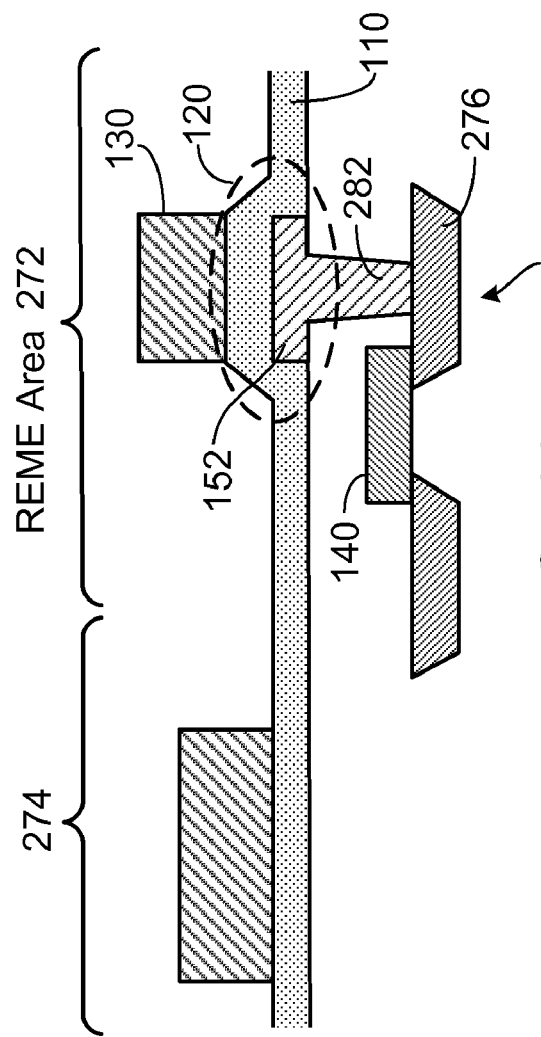
FIG. 10 is a cross sectional diagram of a portion of a recordable electrical memory area and a portion of a chip area outside of the recordable electrical memory area.

FIG. 10 is a cross sectional diagram (not to scale) of a portion of the REME area 272 and a portion of the chip area 274 outside of the REME area 272. The REME area 272 includes an electrical thin-film memory device 100, in which a memory cell 120 is shown in the figure. The memory cell 120 includes a portion of a recordable layer 110 that changes a material/electrical property after inscription.

In examples where the memory cells 120 have one inscribed state, the recordable layer 110 can be a continuous layer that covers the entire chip 270, so that it is not necessary to use an additional photo mask to pattern the recordable layer 110. In examples where the memory cells 120 have multiple inscribed states, the recordable layer 110 can have localized sub-layers. The memory cells 120 can also have one continuous sub-layer and additional localized sub-layer(s).

The recordable layer 110 is positioned between a bit line 130 (which can contact the recordable layer 110 directly or indirectly through an electrode, e.g., 154 in FIG. 2A) and a lower electrode 152. The bit line 130 and the lower electrode are fabricated using the second metal layer and the first metal layer, respectively, of the 1-poly, 2-metal process. A word line 140 is fabricated using the poly-silicon layer of the 1-poly, 2-metal process. A doped nitride region 276 provides an electrical path from the word line 140 to the lower electrode 152.

The devices in the area 274 are also fabricated using the same 1-poly, 2-metal process used for fabricating the memory cells 120. In the area 274, the devices, such as transistors, can be fabricated above and/or below the recordable layer 110.

In some examples, the width of the bit line is 1300 nm, and the thickness of the recordable layer 110 is between about 5 nm to 50 nm.

Figure 11A:
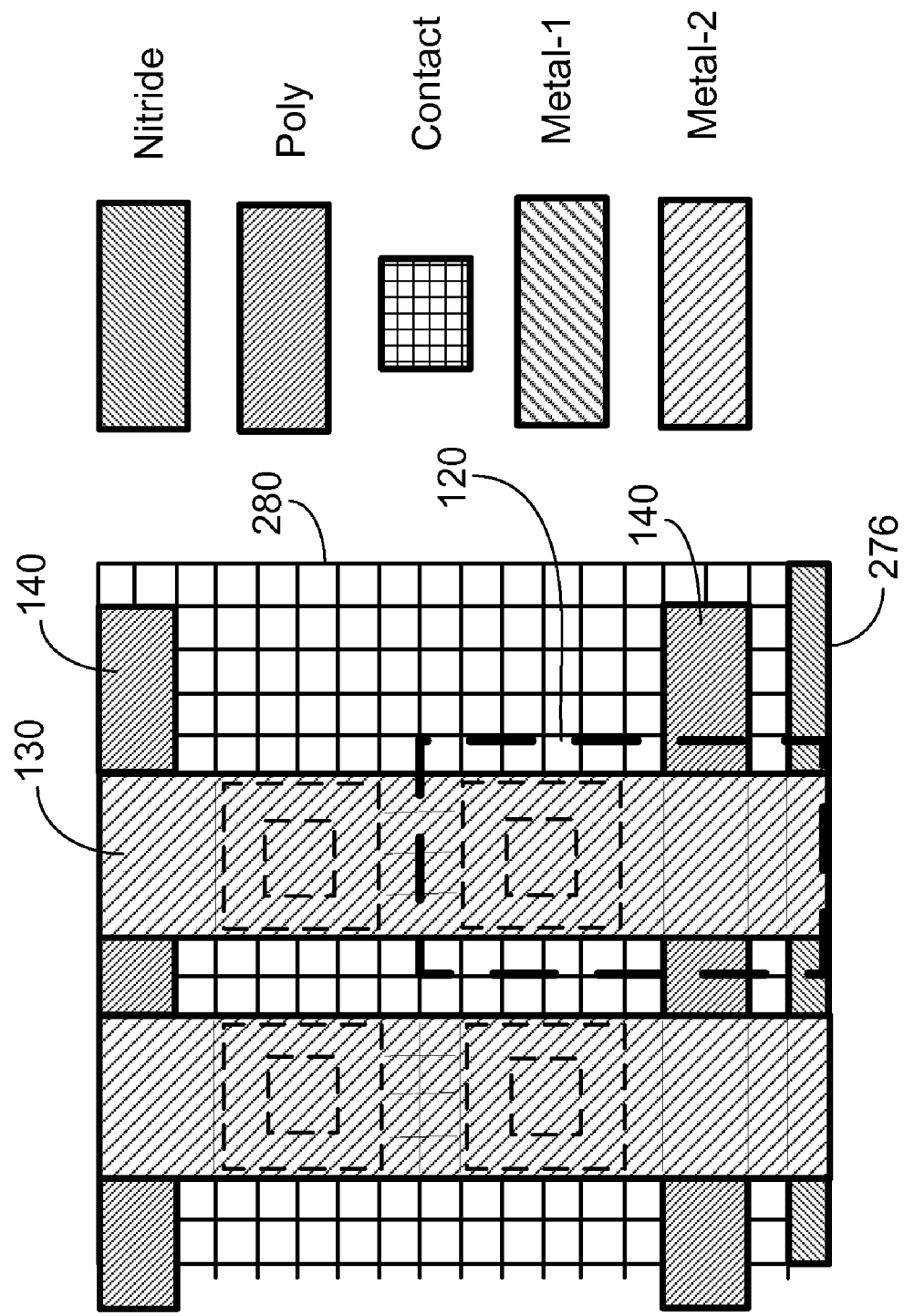

FIG. 11A shows a top view of a layout of an NOR type recordable electrical memory device 100 (with upper layer obscuring lower layers). The figure shows a grid reference 280 in which each small square represents an area of 1λ by 1λ, λ representing the wavelength of light used in the photolithography process to define the geometry of the layers. Each memory cell 120 (one of which is enclosed in thick dashed lines) occupies an area of 6λ by 10λ. This size is comparable to the size of a contact programmable NOR type ROM device. Each memory cell 120 can be accessed by a bit line 130 and a word line 140. FIG. 11A shows two complete memory cells (at the lower portion of the figure) and two partial memory cells (at the upper portion of the figure).

Also shown in FIG. 11A are the legends for the nitride, poly-silicon, contact, metal-1, and metal-2 layers. During fabrication of the device 100, in general, the nitride layer is formed first (deposited, etched, and doped), followed in sequence by the poly-silicon layer, the first metal layer, the recordable layer 110, and the second metal layer.

Figure 11E:
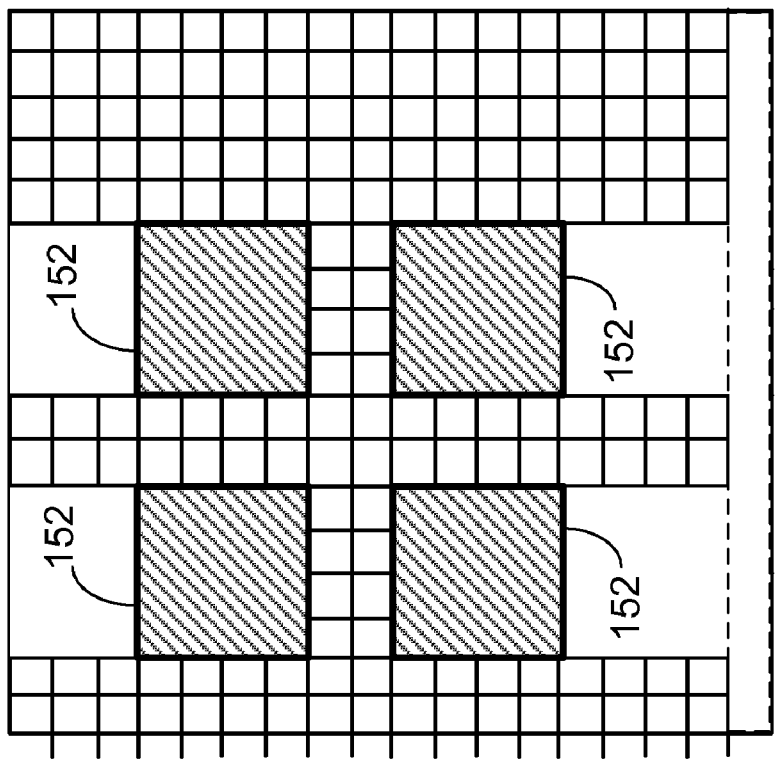
Figure 11D:
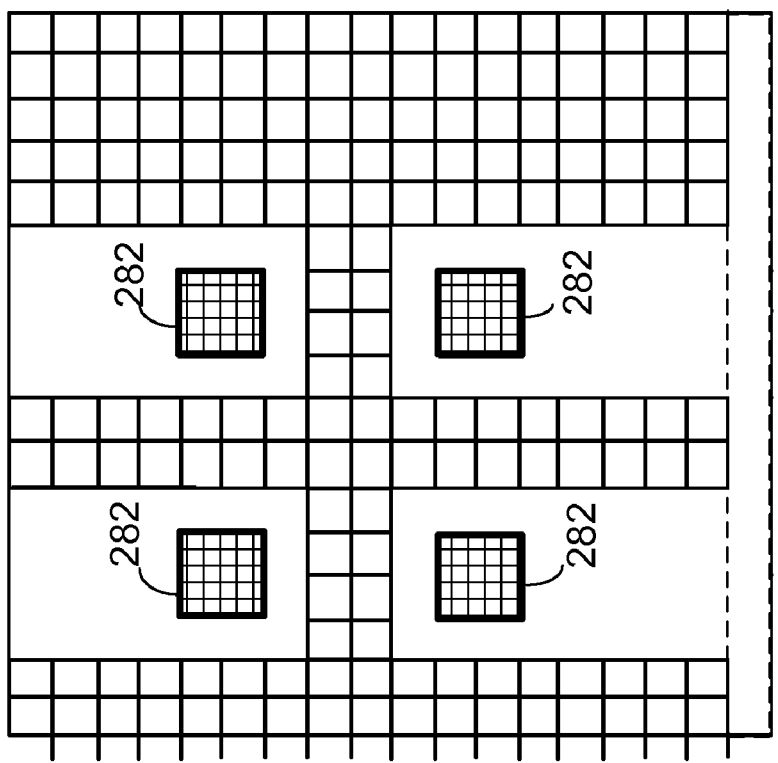

FIGS. 11B to 11F each shows the layout of a different layer of the memory device 100. FIG. 11B shows the layout of the nitride layer 276, a portion of which is doped to provide an electrical path between the poly-silicon word line 140 and the lower electrode 152. FIG. 11C shows the layout of the poly-silicon word lines 140. FIG. 11D shows the layout of a lower portion 282 of the lower electrode 152. FIG. 11E shows the layout of the lower electrode 152, which is made from the first metal layer.

Figure 11F:
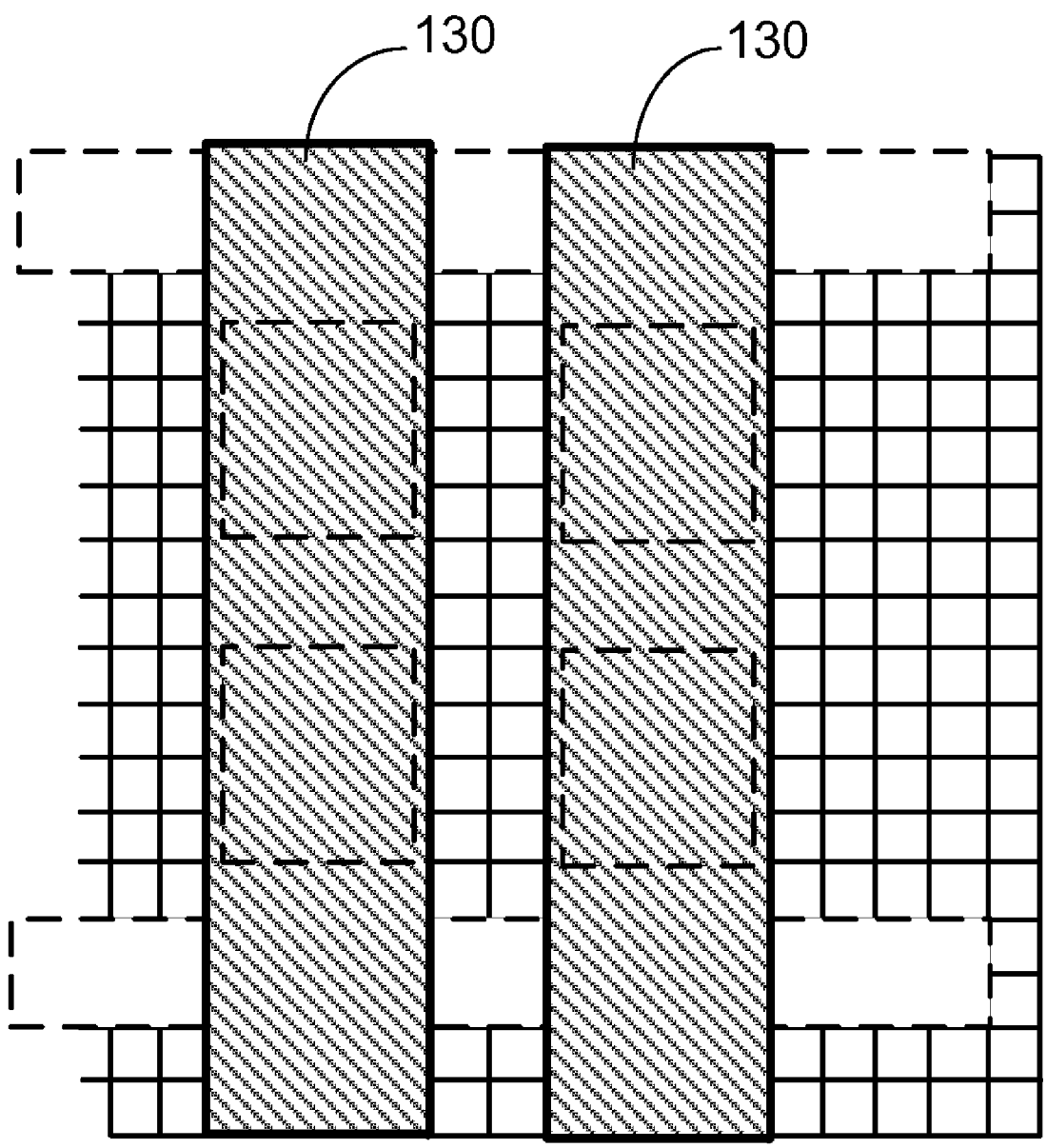

FIG. 11F shows the layout of the bit lines 130, which are fabricated from the second metal layer of the 1-poly, 2-metal process. The recordable layer 110 is positioned between the bit line 130 and the upper portion of the contact 170. The recordable layer 110 is deposited on the chip 270 before the second metal layer is deposited.

When a 130 nm semiconductor fabrication process is used, each memory cell of the recordable electrical memory device 100 can have a dimension of about 260 nm by 260 nm in the x-y plane. The reactions that occur upon application of the initialization signal and the write signal can be endothermic reactions, so there is less heat dissipation problem, allowing multiple recordable layers to be stacked along the z-direction in a single memory device.

The photolithography process for fabricating the memory cells can be implemented using a photolithography system having a light source, a projection lens system, a wafer stage, a photo mask stage, stepper motors for driving the photo mask stage in the X and Y directions, and a programmable controller for controlling the stepper motors. The stepper motors each has a resolution smaller than the smallest width of the memory cell. In some examples, the smallest width of the memory cell is the same as the smallest line width of the photo mask. The wafer stage supports a substrate or wafer on which the memory devices are fabricated. The photo mask stage supports the photo mask (e.g., 190). The system includes a storage storing instructions that when executed cause the programmable controller to control the stepper motors to move the photo mask stage according to a sequence of steps to fabricate memory cells each having a plurality of sub-cells.

For example, assume that the memory cell 120 of FIG. 5D has a dimension of w×w, where w is the smallest line width of the photo mask 190. The stepper motor has a resolution of w/2 so that the photo mask can be shifted a distance as small as w/2 to enable fabrication of sub-cells having dimensions w/2×w/2. To fabricate the memory cell 120 of FIG. 5D, the controller controls the stepper motors to shift the photo mask 190 for a distance of w/2 in the +Y direction so that the opening 192 moves from region A to region B. The stepper motors then shift the photo mask 190 in the −Y direction for a distance of w/2 and in the +X direction for a distance of w/2 such that the opening 192 is moved to the region C.

For example, assume that the memory cell 121 of FIG. 7F has a dimension of w×w, where w is the smallest line width of the photo mask 190. The stepper motor has a resolution of w/3 so that the photo mask can be shifted a distance as small as w/3 to enable fabrication of sub-cells having dimensions w/3×w/3. To fabricate the memory cell 121 of FIG. 7F, the controller controls the stepper motors to shift the photo mask 190 for a distance of 2w/3 in the +X direction before forming the material layer B (FIG. 7B). The stepper motors shift the photo mask 190 for a distance of 2w/3 in the −X direction, then shift the photo mask 190 for a distance 2w/3 in the −Y direction before forming the material layer C (FIG. 7C). The stepper motors shift the photo mask for a distance of 2w/3 in the +Y direction and a distance of 2w/3 in the −X direction before forming the material layer D (FIG. 7D). The stepper motors shift the photo mask for a distance of 2w/3 in the +X direction and a distance of 2w/3 in the +Y direction before forming the material layer E (FIG. 7E).

3. Theory of Thin Layers

The recordable layer 110 is thin. For example, in FIGS. 5A to 5E, the layers of materials A, B, and C can have thicknesses 28 nm, 5 nm, and 7 nm, respectively. Material properties a thin layer of material M can be different from the material properties of the material M in bulk form. Without being limited by any theory presented herein, behavior of recordable layers having thin sub-layers may be at least partially understood according to the following. A parameter, referred to as the Debye length of a material, relates generally to the distance in the material to which the applied charges or fields have effect. The Debye lengths of materials of the recordable layer can be useful to predict or explain the behavior of the recordable layer.

The combination of materials M1 and M2 during inscription may be aided by a strong electric field created in the charges moved across the interface between M1 and M2, and the thinness of the recording layer relative to the Debye length of the materials in the recordable layer. That is, even without the addition of an external electric field (e.g., between conductors), the charge transfer creates a significant electric field.

The Debye length of a material, which relates generally to the thickness of the cloud of charge carriers in the material that shields an applied charge or electric field depends on the charge carrier density. When a charged particle is placed in a material, the charged particle will attract charge carriers having opposite polarity, so that a cloud of charge carriers will surround the charged particle. The cloud of charge carriers shields the electric field from the charged particle, and the higher the charge carrier density, the greater the shielding effect within a given distance. Due to shielding by the charged particles, the electric potential φ decays exponentially according the equation $$\phi = \phi_0 \cdot \exp(-|x|/\lambda_D),$$

where $\phi_0$ is the electric potential at the charged particle, x is the distance from the charged particle, and $\lambda_D$ is the Debye length, which can be represented by:

$$\lambda_D = \frac{1}{e}\sqrt{\frac{K \cdot T_e}{4\pi n}} \approx 6.9 \sqrt{\frac{T}{n}} \text{ cm } (T \text{ in } °K). \quad \text{(Equ. 1)}$$

See "Introduction to Plasma Physics," by Francis Chen, Section 1.4: Debye Shielding, pages 8-11. The Debye length represents a measure of the shielding distance or thickness of the cloud of charge carriers.

When there are fluctuations in an electric field created by changes in a localized charge density in a material, the influences of the fluctuations are mostly felt by charge carriers located within a few Debye lengths. The charge density changes can be induced by, for example, charge carriers moving through interfaces, or charge density fluctuations induced by outside electromagnetic field or due to thermal effects.

When two materials having different electron energy levels (such as different highest unoccupied electron energy level, called conduction band, or HUMO, and lowest occupied electron energy level, called valance band, or LOMO) contact, charge separation will cause an electric field to be generated at the interface. The influence of the electric field is shielded or reduced by a sheath of charge carriers near the interface. When the two materials are thin layers, for example, the total thickness of the thin layers is less than the Debye length, there will be a strong electric field throughout the entirety of the two layers, which can be as strong as 100,000 V/cm. The strong electric field can assist the materials in the two layers to interact and combine upon an energy application (such as dissipated thermal energy induced by the write signal). By comparison, when the layers are thick, the electric field in most of the cross-section of the layers is negligible and does not provide assistance in the interaction of the materials in the two layers.

The same principle can be applied to the interaction or combination of three or more thin layers of materials.

For semiconductors, n (in Equ. 1) is about $10^{17}$ to $10^{19}$, its square root is about $3 \times 10^8$ to $3 \times 10^9$, and T is about 300° K at room temperature, so the Debye length is about 10 to 100 nm. For metals, n is about $10^{21}$ to $10^{23}$, so the Debye length is about 1 to 10 nm. For example, the Debye length for aluminum is less than 1 nm at room temperature, and is about 2 nm at 700° K. The Debye length for Ge doped with impurities is about 30 nm to 80 nm at room temperature, depending on the concentration of impurities.

A feature of a recordable layer having thin layers is that the large electric field can assist endothermic reaction, which does not release heat during the reaction. Only a small area power density (watts/m$^2$) is required to cause the combination of the two layers. The recorded mark is well defined—only the portion of the two layers in which the electric current passes so as to generate thermal energy above an absorbed threshold volumetric power density, and also above an absorbed threshold volumetric energy density (i.e., to have enough power level and enough duration time of high-power), will combine.

An advantage of using thin layers is that less energy may be required to cause the thin layers to combine. For a given write speed, the write signal can have a lower voltage (for example, compared to the writing voltage of a flash memory). For a given write signal having a specified voltage, a shorter duration of the write signal can be used for writing to each memory cell, resulting in a faster writing speed. Another advantage of using thin layers is that less materials for the layers are required, thereby reducing the material costs and the processing costs of coating or depositing the layers. When expensive materials are used for the layers, such as gold or silver, the cost savings for manufacturing a large number of memory devices can be significant.

When there is a strong electric field, there is an electric potential across the interface, so a small amount of energy can cause the molecules to move across the interface (from a higher potential region to a lower potential region), causing a materials from the two layers to combine. Combination of two thin layers can be achieved by, in various versions of the system, for example, without limitation, mixing, boundary blurring, alloying, chemical reaction, diffusion, or field induced mass transfer over boundary. The reaction between the two or more layers can be endothermic or exothermic.

4. Design and Fabrication of the Memory Devices

The materials and thicknesses of the recordable layer 110 or its sub-layers can be selected based on information from a pre-established database. The database can be established by measuring the electrical properties of various thin layers or combinations of thin layers of various materials. The database can include information about the resistance per unit area, and diode-like characteristics, of (1) a single layer of material at different thicknesses, and (2) various combinations of materials of varying thicknesses, before and after application of an initialization signal, and before and after application of different write signals. The materials and thicknesses of the layers are selected to achieve a desired contrast in resistance in the as-deposited state, the initialized state, and the inscribed state(s).

A variety of manufacturing approaches can be used to fabricate the thin sub-layers of the recordable layer 110. For example, each layer can be formed on top of the previous layer by physical vapor deposition (PVD), chemical vapor deposition (CVD), plasma enhanced chemical vapor deposition (PECVD), metal organic chemical vapor deposition (MOCVD), or molecular beam epitaxy (MBE).

The recordable electrical memory device 100 can be fabricated using standard CMOS (complementary metal oxide semiconductor) processes. Because of the simple structure of the thin film memory device 100, the memory device 100 can be fabricated using a 2-metal, 1-poly process.

5. System Architecture

Figure 12:
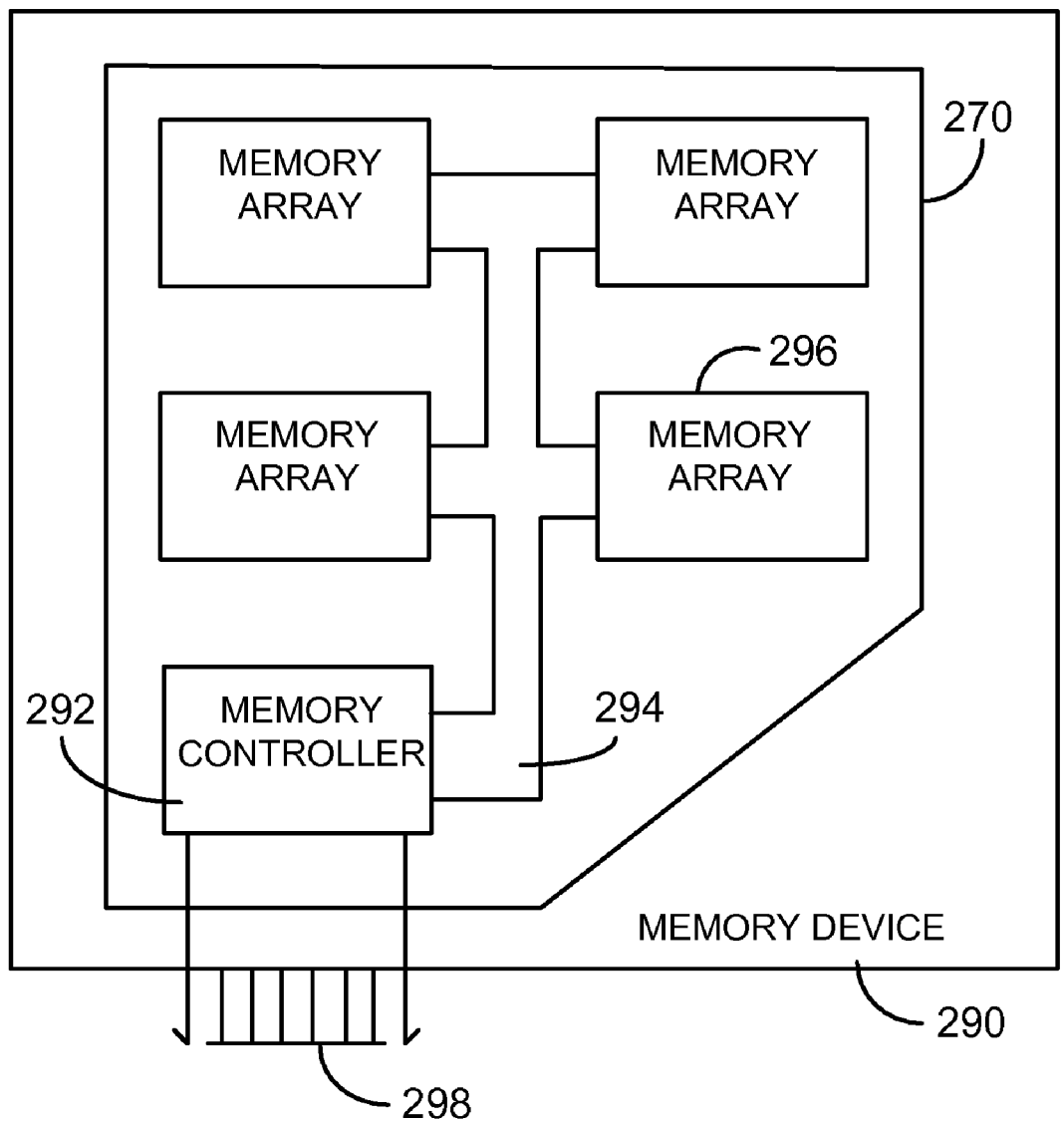
FIG. 12 is a block diagram of a memory device that includes a memory controller and multiple memory arrays.

FIG. 12 is a block diagram of a memory device 290 that includes the chip 270, which has a memory controller 292 and multiple memory arrays 296. Each of the memory arrays 296 can be similar to the memory device 100 (FIG. 1A) having memory cells 120 (FIGS. 2A, 5D, 7F, 8, and 10). The memory controller 292 controls the memory arrays 296 through buses 294. The memory controller 292 also interacts with a host device (not shown), such as a computer or a digital camera, through an interface 298. The memory device 290 may comply with interface standards such as Universal Serial Bus or IEEE 1394 (Firewire) standards. The memory device 290 can be made into a memory card, and partially comply with, for example, the coding/decoding schemes of Compact Flash, Secure Digital, Memory Stick, or XD Memory Card standards. The memory device 290 is a write-once device rather than a re-writable device. The memory device 290 does not necessarily have to comply with the read/write voltages of the standards listed above.

The memory controller 292 may operate in a manner compatible with existing flash memory devices. In some examples, the memory controller 292 is compatible with NOR flash architecture, and writes data to the memory arrays 296 one byte or word at a time. In some examples, the memory controller 292 is compatible with NAND flash architecture, which read/write the data sequentially in a predefined length of memory strings, but can randomly access which string to be read from or written to.

Figure 13:
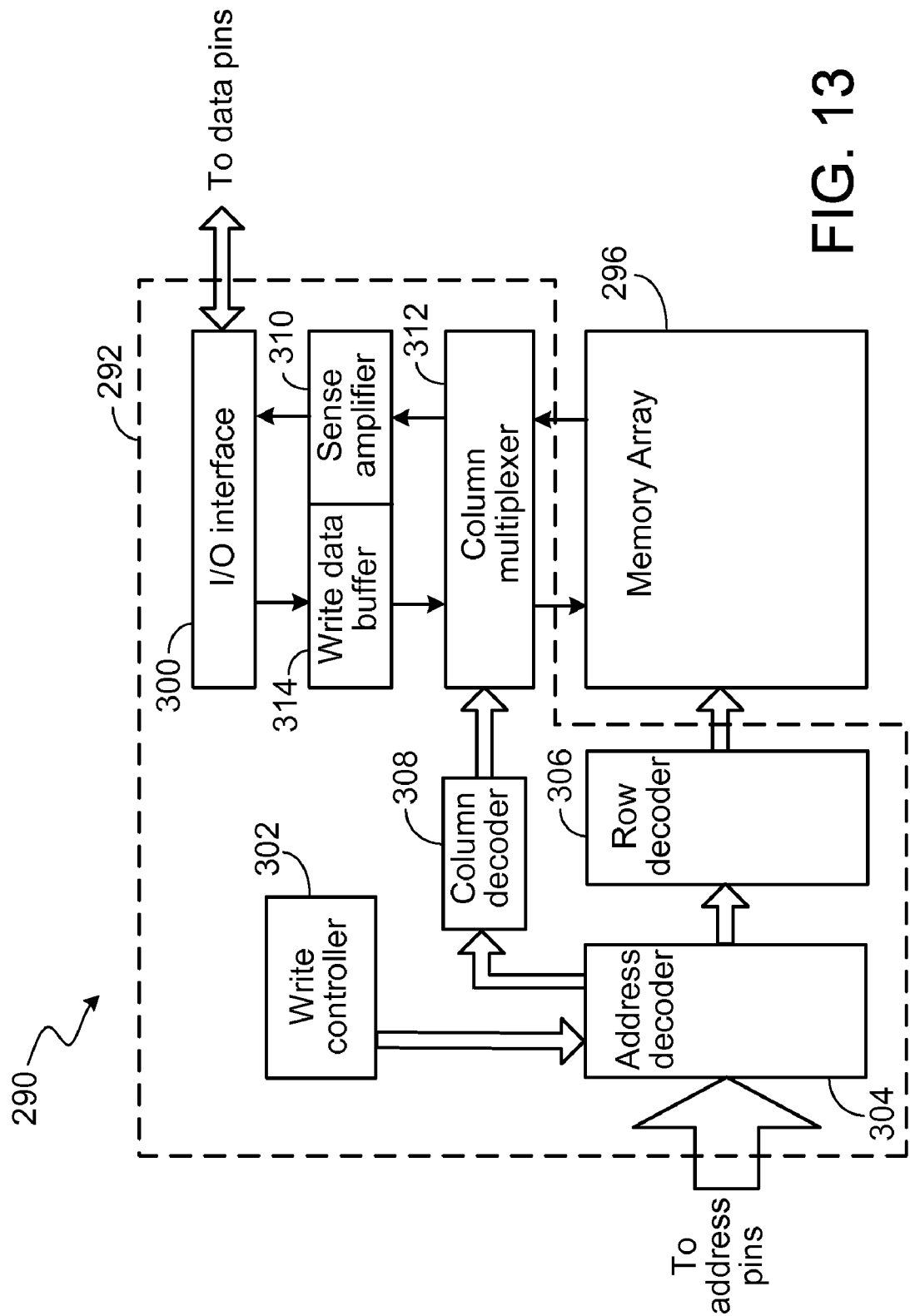
FIG. 13 is a block diagram of a memory controller.

Referring to FIG. 13, the memory controller 292 includes an input/output interface 300 that receives commands and writes data from, and outputs read data to, data pins. The commands are sent to a write controller 302 that controls how data are written to or read from the memory array 296. The write controller 302 controls an address decoder 304 that receives addresses of the memory cells to be accessed from address pins. The address decoder 304 sends row and column information to a row decoder 306 and a column decoder 308, respectively, which determine which word line and bit line to activate to access specific memory cells. A write data buffer 314 stores data to be written to the memory array 296. A sense amplifier 310 amplifies the signals (read data) read from the memory array 296. A column multiplexer 312 multiplexes the write data and the read data on the bit lines of the memory array 296.

For example, upon receiving an initialization command, the memory controller 292 may send an initialization signal having a voltage level of, e.g., 1V, to all the memory cells 120 in the memory array 296 to initialize the memory cells 120. Later, upon receiving a write command, the memory controller 292 may send a write signal to specified memory cells to write data in the cells. The write signal can have a voltage level greater than, e.g., 2V, and can have a pulse waveform that includes one or more pulses. The voltage level of the write signal depends on the type of the memory cells (such as whether the memory cells are configured to store binary, ternary, quaternary data), and the data to be written to the memory cells (such as whether to write "1," "2," "3,", or "4" in a memory cell capable of storing quaternary data). Upon receiving a read command, the memory controller 292 may send a read signal having a voltage level of, for example, 10 to 500 mV, to specified memory cells to read data from the cells by measuring the current and comparing the measured current with predetermined reference values.

In some examples, the memory controller 292 can translate between virtual memory addresses and physical memory addresses. The host device sends virtual memory addresses to the memory controller 292. The memory controller 292 translates the virtual addresses to physical addresses and accesses memory cells according to the physical addresses. The memory device 290 may be tested at the factory for defects using a process described below, and the addresses of defective cells can be stored in a table. When the host device writes to the memory device 290, the memory controller 292 avoids the defective cells and only writes to functional memory cells.

In some examples, when the host controller sends an erase command to erase data at certain virtual addresses, the memory controller 292 may mark corresponding physical addresses as being "erased," so that the data at those physical addresses cannot be retrieved. When the host device sends a write command to write to a virtual address that has previously been erased, the memory controller 292 translates the virtual address to a different physical address and writes to the new physical address. In this way, even though the memory cells are write-once only and cannot be physically erased, the memory device 290 will appear to the host device as if the memory cells can be erased for a limited number of times.

After the memory device 290 is fabricated and packaged, the memory cells 120 of the memory array 296 can be tested according to the following process.

Step 1: The gate transistor for each word line 140 is checked to determine whether there is a defect. If the gate transistor for a particular word line 140 is defective, the memory cells 120 using the particular word line 140 can not be used to record data. Neither inscription nor reading is performed to any of the memory cells 120 associated with the defective word line 140 when the memory device 290 is used. The world line 140 is recorded as defective in a table (which can be located at an area of the memory array 296 designated for recording defects).

During testing of the device 290, information about defective word lines 140 or memory cells 120 can be first stored in a memory of a host device (e.g., computer) that is testing the device 290. When the memory cells 120 of the device 290 are initialized, the information about the defective components are written to the table.

Step 2: The gate transistor of each bit (data) line 130 is checked to determine whether there is a defect. If the gate transistor of a bit line 130 is defective, the memory cells 120 using the bit line 130 cannot be used to store data. Neither inscription nor reading is performed to any of the memory cells 120 associated with the defective bit line 130 when the device 290 is used. The bit line 130 is recorded as defective in the table.

Step 3: Each of the memory cells 120 addressed by the two gate transistors that passed the tests in steps 1 and 2 is checked by applying a read signal. Each memory cell 120 should have a low resistance value in the as-deposited state. If a particular memory cell 120 has a resistance that is higher than a predetermined threshold, the particular memory cell 120 is defective, and the address of the defective memory cell 120 is recorded in the table.

Step 4: An initialization signal having one or a series of pulses having predetermined voltage level(s) is applied to each of the memory cells 120 that passed the tests in steps 1 to 3. The initialization signal causes the memory cells 120 to enter the initialized state and have diode-like current-voltage characteristics. A read signal is applied to each of the initialized memory cell 120 to determine the resistance of the cell. A memory cell should have a high resistance value in the initialized state. If a particular memory cell 120 has a resistance below a predetermined threshold, the memory cell 120 is marked as defective.

After the tests in steps 1 to 4 are performed, the number of defect memory cells 120 in the memory device 290 are counted to determine whether the memory device 290 is suitable for sale at a certain grade or should be discarded.

Figure 14:
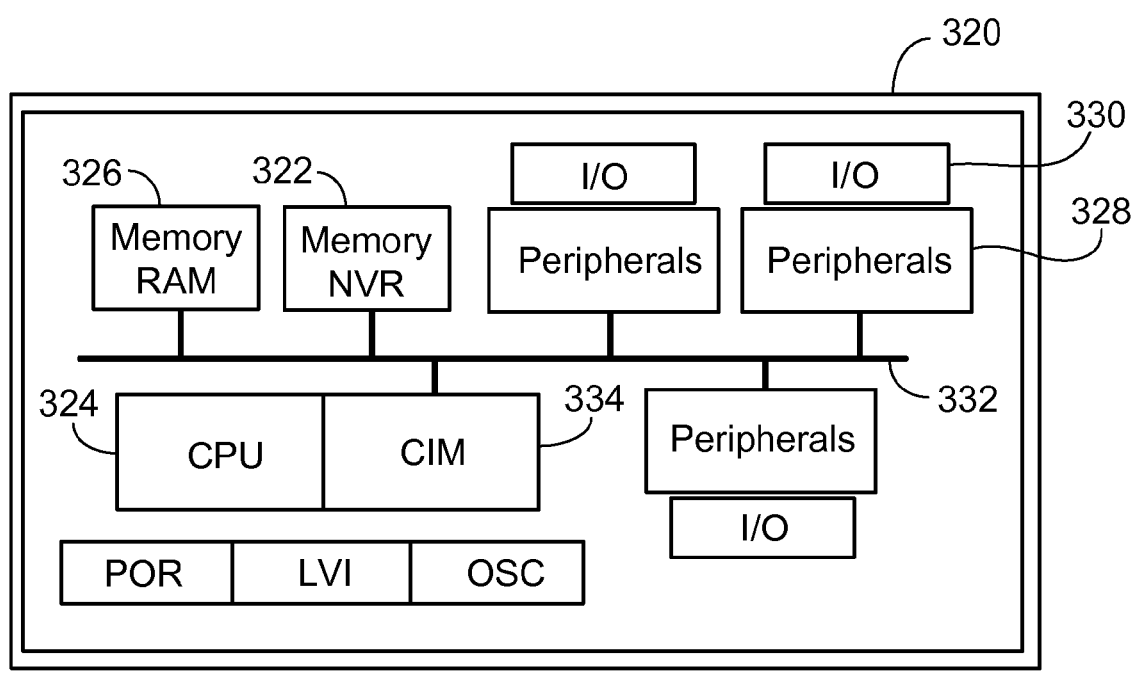
FIG. 14 is a block diagram of a micro-controller unit that includes a recordable electrical memory device 100.

Referring to FIG. 14, the recordable electrical memory device 100 can be used as a non-volatile recordable (NVR) memory 322 of a micro-controller unit 320. The micro-controller unit 320 also includes a central processing unit 324 and a random access memory (RAM) 326. The non-volatile memory 322 allows the user to customize programs (e.g., obtaining a most recent version of firmware) before permanently writing the programs into the memory 322. During run time, the programs are loaded from the non-volatile memory 322 and stored in the RAM 326 to allow faster access of the program code. The micro-controller unit 320 includes peripheral modules 328 for processing signals from input/output ports 330. The unit 320 includes a chip integration module (CIM) 334 and supporting modules POR, LVI, and OSC. The various modules communicate with one another through a bus 332.

Although each memory cell of the non-volatile memory 322 can be programmed only once, the non-volatile memory 322 can be made to have a capacity several times larger than the amount required for storing one version of the firmware. When the firmware needs to be upgraded, the new version of the firmware is written to a different portion of the non-volatile memory 322. This way, the non-volatile memory 322 can be programmed a finite number of times to store multiple versions of the firmware, each time writing to a different portion of the memory 322.

6. Examples of Recordable Layers

Samples of recordable electrical memory devices were prepared and their electrical properties before and after initialization and inscription were measured. Each recordable electrical memory device included a recordable layer having one or more thin semiconductor layers sandwiched between two metal electrodes. One sample of the memory device was configured to store one inscribed state. Two samples of the memory device were configured to store four inscribed states.

Figure 15:
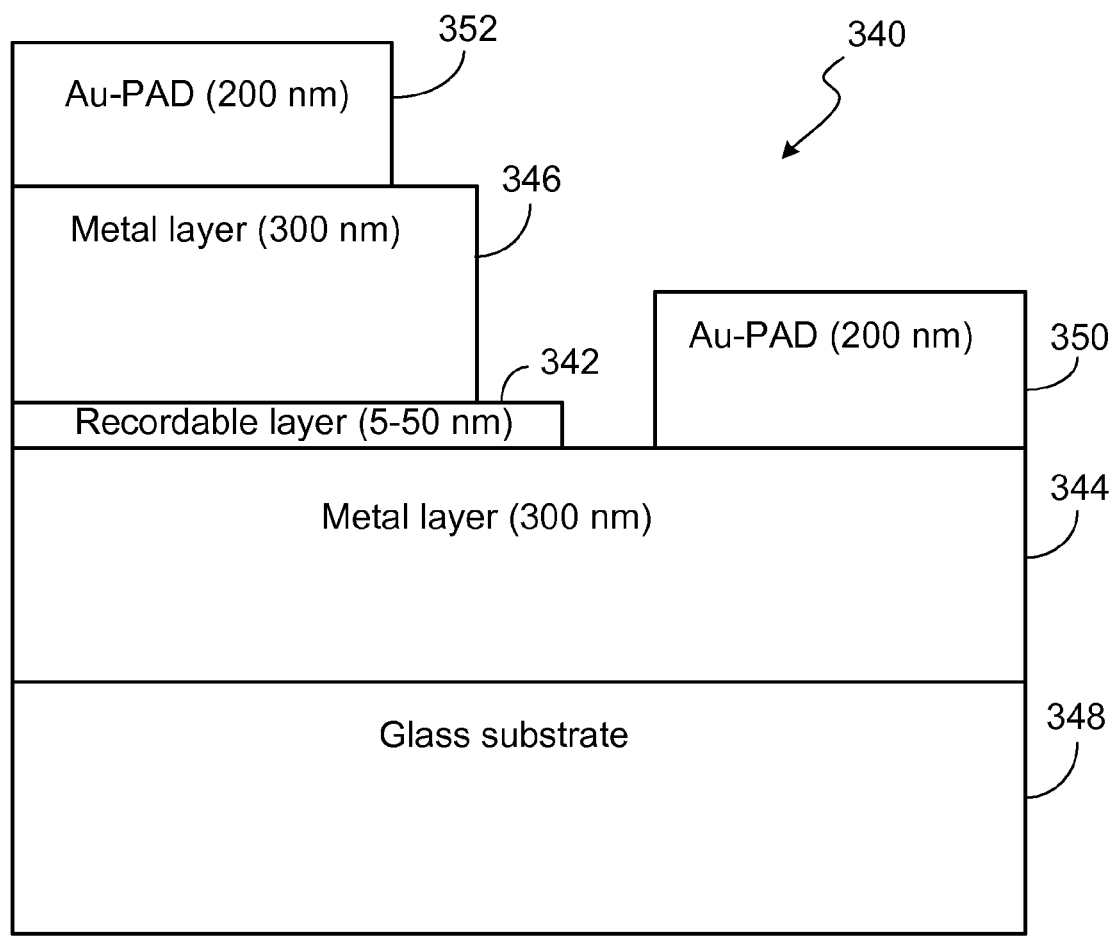
FIG. 15 is a schematic diagram representing recordable electrical memory devices.

FIG. 15 is a schematic diagram representing recordable electrical memory devices 340 that were prepared. The recordable electrical memory device 340 included a recordable layer 342 positioned between two layers of metal electrodes 344 and 346. The metal layers 344, 346 and the recordable layer 342 were deposited on a glass substrate 348. Gold contacts 350 and 352 were deposited on the metal layers 344 and 346, respectively, to provide sufficiently large probe areas and to provide good ohmic contacts between the metal layers and the probes used to measure the electrical characteristics of the memory device 340.

In one sample, the memory device 340 was configured to have one inscribed state. The recordable layer 342 included islands of materials with spacing between the islands to allow portions of the metal layer 346 to contact the metal layer 344. The recordable layer 342 was made of p-type silicon and has a thickness of about 3 nm. The metal layers 344 and 346 were made of aluminum, and each has a thickness of about 250 nm.

The recordable electrical memory 340 was fabricated using the following process. Prior to depositing the thin films, the glass substrate 348 was cleaned by using a ultrasonic cleaner and was soaked in acetone or ethanol for several minutes. A Modular Single Disk Sputtering System "Trio CUBE" (Balzers) equipped with two DC cathodes and one RF cathode, available from Unaxis, Balzers, Likenstain, was used to deposit the layers. The base pressures of the main chamber and the process chamber were maintained below $10^{-7}$ mbar. The operation pressure in the process chamber was set to be in the range of $10^{-3}$ to $10^{-2}$ mbar during film deposition. When depositing the layers, the thicknesses of the layers were controlled by controlling the sputtering time The thickness of each of the thin layers was measured and estimated based on the sputtering yield of the material, the sputtering time (typically from 1 to 20 seconds), and the sputtering power density (typically 4 to 15 W/cm$^2$) used for the layer.

The sample has an overall dimension of 32×24 mm$^2$. The area between the two metal layers 344 and 346 was about 83 mm$^2$.

FIGS. 16A and 16B are graphs that show experimental data for the sample of the recordable electrical memory 340 that was configured to have one inscribed state. The data show that, for voltages between −1.8V and 1.8V, the recordable electrical memory 340 has resistor-like current-voltage characteristics in the as-deposited state, diode-like current-voltage characteristics in the initialized state, and resistor-like current-voltage characteristics in the inscribed state.

FIG. 16A is a graph 360 that shows curves 362 and 364 representing the current-voltage characteristics of the memory device 340 in the as-deposited state and the initialized state, respectively. FIG. 16B is a graph 360 that shows the curve 364 and a curve 366 that represents the current-voltage characteristics of the memory device 340 in the inscribed state. The measurements were obtained for voltages between −1.8V to 1.8V.

The curve 362 indicates that, in the as-deposited state, the current flowing through the memory device 340 is approximately linearly proportional to the applied voltage, and the resistance is small, about 2.3Ω. The curve 364 indicates that, in the initialized state, the current flowing through the memory device 340 is initially small but gradually increases. When the voltage is below 1V, the current is less than 50 mA. When the voltage is greater than 1.7 V, the current increases significantly. This is similar to the current-voltage characteristics of a diode having a threshold voltage of about 1.7 V.

The curve 366 indicates that, in the inscribed state, the current flowing through the memory device 340 is approximately linearly proportional to the applied voltage, and the resistance is slightly higher than that in the as-deposited state. The resistance in the inscribed state is about 2.7Ω (in which the sample has an area of 83 mm$^2$).

Figure 17A:
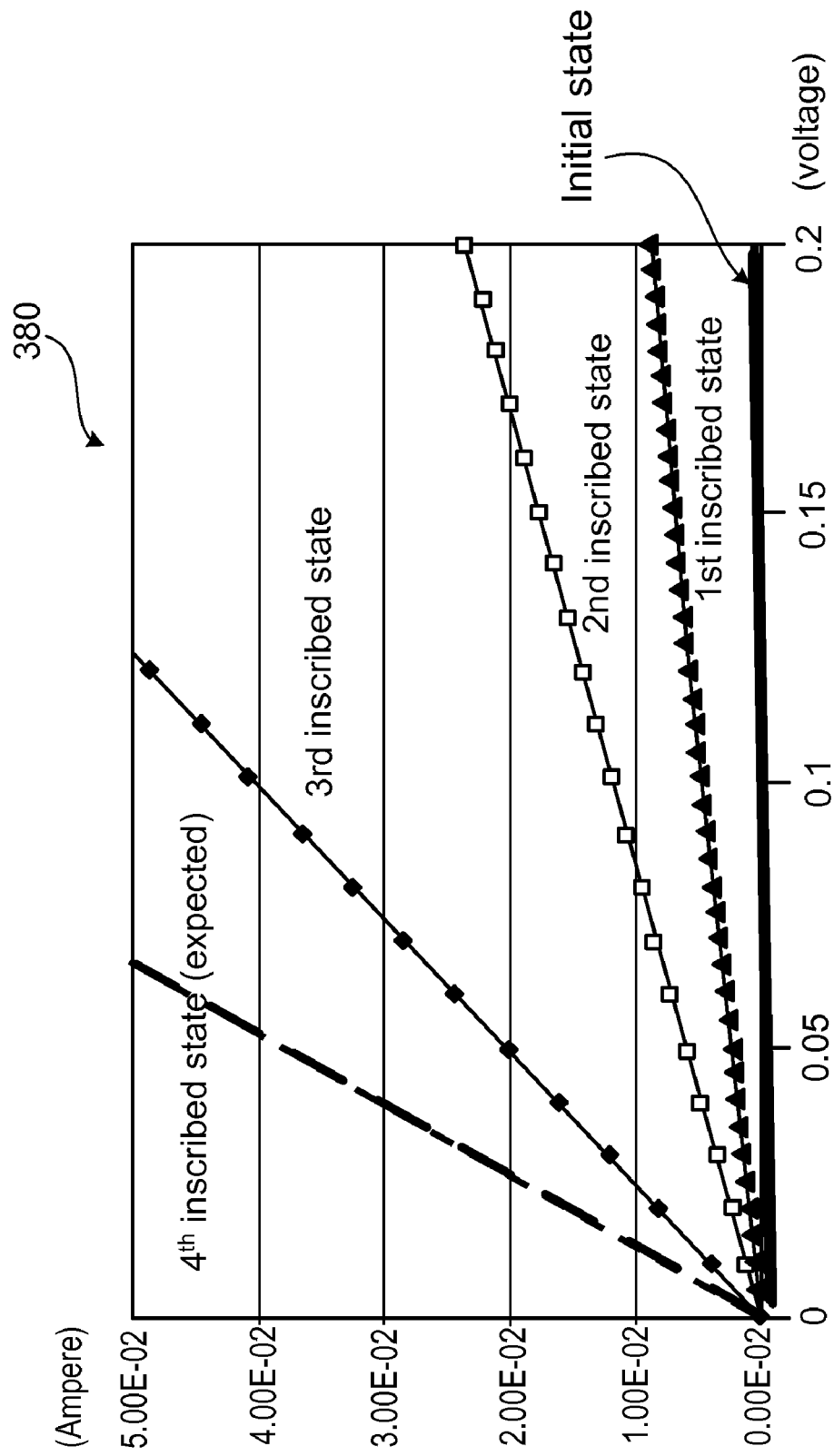
FIGS. 17A and 17B are graphs that show experimental data for samples of recordable electrical memory devices that are configured to have three inscribed states.
Figure 17B:
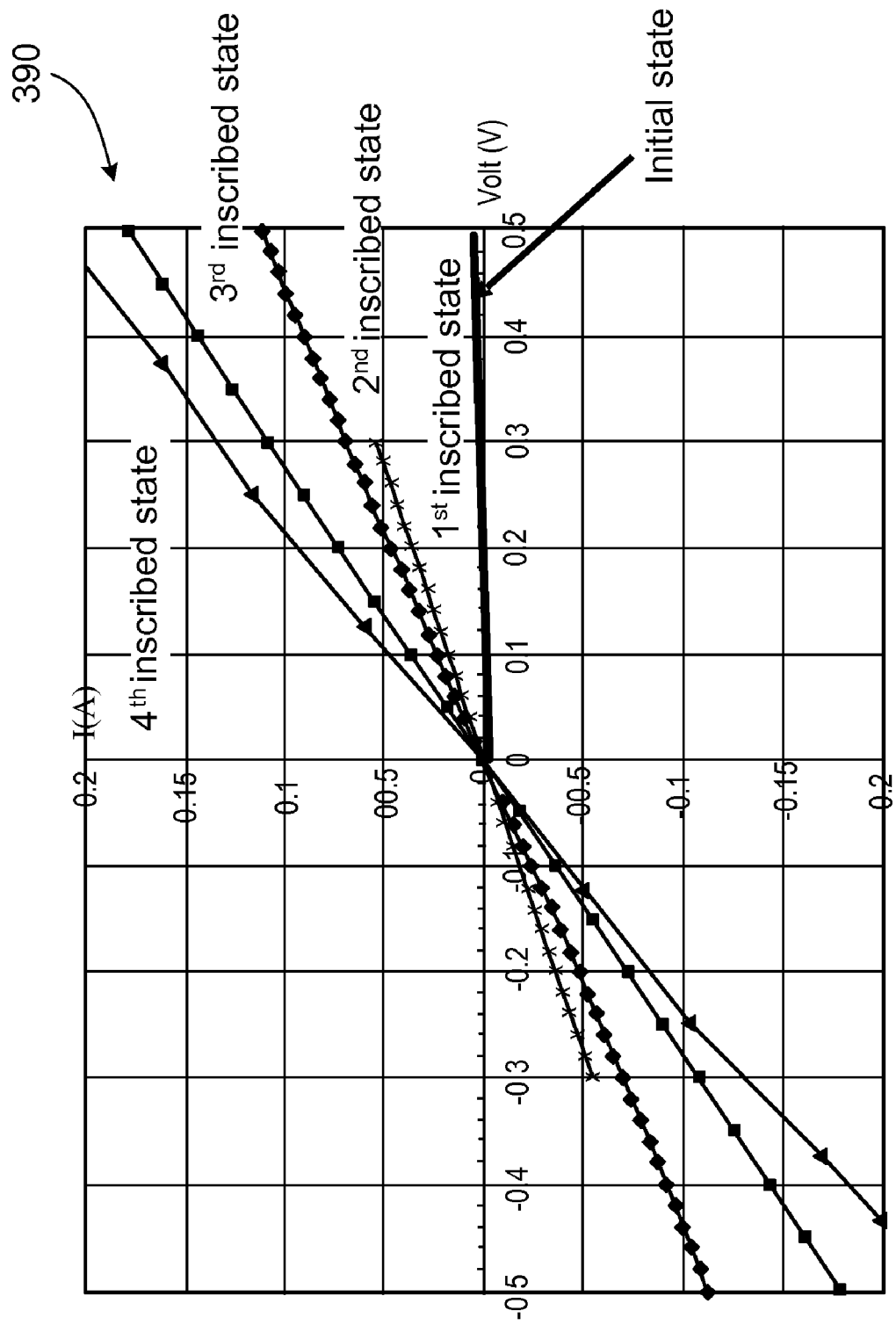

FIGS. 17A and 17B are graphs 380 and 390, respectively, that show experimental data for the two samples of the recordable electrical memory device 340 that are configured to have three inscribed states. The recordable layer 342 has sub-layers A, B, and C similar to those shown in FIG. 5E. The sub-layers A, B, and C of the recordable layer 342 is made of p-type germanium and have thicknesses of 28 nm, 5 nm, and 7 nm, respectively. The data show that, for voltages between −0.5V and 0.5V, the recordable electrical memory 340 has an initialized state having a high resistance, and three distinct inscribed states each having resistor-like current-voltage characteristics. The inscribed states have resistances that are smaller than that of the initialized state. The differences between the two samples of FIGS. 17A and 17B may have been due to variations in the thicknesses of the sub-layers due to deposition equipment tolerances.

7. Alternative Recording Structures

In the examples above, generally, a recordable electrical memory device has one recordable layer. Alternatively, a recordable electrical memory device can also have two or more recordable layers, each including one or more thin sub-layers. The additional recordable layers allow the memory device to have a larger storage capacity.

Figure 18:
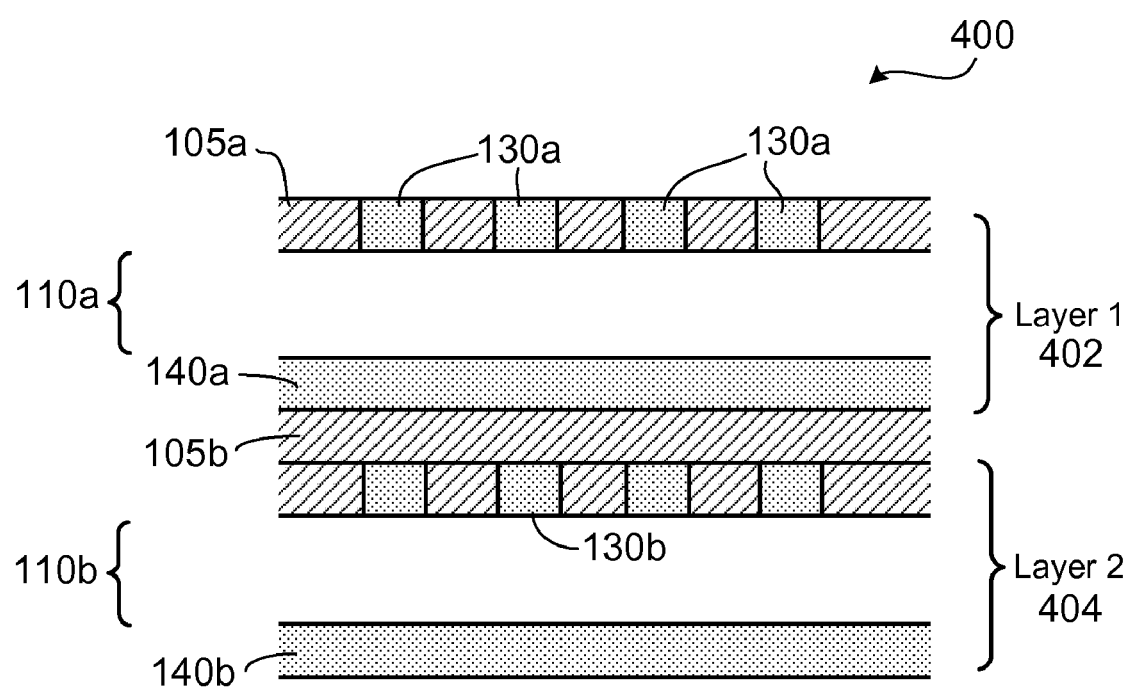
FIG. 18 is a schematic diagram of a cross section of a dual-layer recordable electrical memory device.

FIG. 18 is a schematic diagram of a cross section of a dual-layer recordable electrical memory device 400 that includes a first layer 402 and a second layer 404. The first layer 402 includes word lines 140*a*, a recordable layer 110*a*, and bit lines 130*a*. The recordable layer 110*a* may include one or more sub-layers and can be configured to have one or more inscribed states. The recordable layer 110*a* can be a continuous layer that spans several memory cells, or be localized to each memory cell. A layer of insulating material 105*a* fills the space between bit lines 130*a*.

Similar to the first layer 402, the second layer 404 includes word lines 140*b*, a recordable layer 110*b*, and bit lines 130*b*. The recordable layer 110*b* may include one or more sub-layers and can be configured to have one or more inscribed states. The recordable layer 110*b* can be a continuous layer that spans several memory cells, or be localized to each memory cell. A layer of insulating material 105*b* fills the space between bit lines 130*b*, and also serves as a buffer between the first and second layers 402 and 404.

In some examples, the recordable layer 110*a* is configured to have the same number of inscribed states as the recordable layer 110*b*. In some examples, the recordable layer 110*a* is configured to have a number of inscribed states different from that of the recordable layer 110*b*. For example, a first recordable layer 110*a* can have a inscribed state, and the second recordable layer 110*b* can have four inscribed states. The recordable layer 110*a* may provide a faster read/write speed with a lower data density because a smaller number of inscribed states allows a higher error margin. The recordable layer 110*b* may provide a slower read/write speed with a higher data density because a larger number of inscribed states allows a smaller error margin.

In some examples, if the memory cells in the first layer 402 and the second layer 404 are not accessed simultaneously, then the word line 140*a* of the first layer 310*a* and the bit line 130*b* of the second layer 310*b* can be combined. The same word line 140*a* can be used to send write and read signals to memory cells in the first layer 402 or the second layer 404 at different times.

Each of the first layer 402 and the second layer 404 operates in a manner similar to the memory device 100, in which the memory cells have resistor-like I-V characteristics in the as-deposited state, diode-like I-V characteristics in the initialized state, and resistor-like I-V characteristics in the inscribed state(s).

Similar to the process for manufacturing the memory device 100, a variety of manufacturing approaches can be used to fabricate the recordable layers of the memory device 400. For example, each layer can be formed on top of the previous layer by physical vapor deposition (PVD), chemical vapor deposition (CVD), plasma enhanced chemical vapor deposition (PECVD), metal organic chemical vapor deposition (MOCVD), or molecular beam epitaxy (MBE).

8. Additional Alternative Examples

A number of examples have been described. Nevertheless, it will be understood that various modifications may be made without departing from the spirit and scope of the invention. For example, the recordable layer 110 and its sub-layers can have materials and thicknesses different from those described above. The recordable layers can be made using methods other than those described above. In FIG. 10, rather than covering the entire chip area with the recordable layer 110, an additional photo mask can be used to pattern the recordable layer 110 so that the layer 110 only covers the REME area 272, or portions of the REME area 272. In FIG. 18, the memory device 400 can include three or more layers that are similar to the layers 402 and 404. In FIG. 2A, the metal material filling the openings 156 of the recordable layer 110 does not have to be the same as the upper and lower electrodes 154 and 152. For example, after the recordable layer 110 is formed above the lower electrode 152, a first metal is be deposited to fill the openings 156, and a second metal is deposited to form the upper electrode 154.

The memory device can be a memory card having interface and/or physical dimensions that comply with various storage standards, such as flash memory standards. The memory device can also have an arbitrary shape. The memory device does not necessarily have to be flat, and can, for example, conform to the surface contour of a cube, a ball, or any other arbitrary volume. The memory controller can have different configurations so that the processes for writing and reading data are different from those described above. The recordable electrical memory device can be integrated into systems other than those described above.

The alignment shifting technique shown in FIGS. 5A to 5E and 7A to 7F can be modified in various ways, e.g., by changing the number of different positions in which the photo mask 190 is shifted and the directions of shifts. Memory cells each having, e.g., 3, 5, 6, 7, 8, 10, or more sub-cells can be fabricated. For example, the memory cell shown in FIG. 7D includes 6 sub-cells.

The recordable electrical memory device can be written using, for example, magnetic or optical methods, and read electronically. For example, instead of applying electrical pulses to selected memory cells to write marks in the cells, a light beam may be used to apply energy to selected memory cells to write the marks. After the marks have been written, an electric read signal is applied to memory cells to detect contrast in electrical properties, such as resistance, to read information stored in the memory cells. The read and write voltages can be positive or negative.

Other implementations are within the scope of the following claims.

What is claimed is:

1. A method comprising:
   fabricating a memory cell of a memory device, comprising
      forming a first electrode on a substrate;
      positioning a photo mask at a first position relative to the substrate;
      forming a first material layer on the first electrode based on a pattern on the photo mask;
      positioning the photo mask at a second position relative to the substrate;
      forming a second material layer above the first material layer based on the pattern on the photo mask, the second material layer being offset from the first material layer so that a first sub-cell of the memory cell includes the first material layer and not the second material layer, and a second sub-cell of the memory cell includes both the first and second material layers; and
      forming a second electrode above the first and second material layers and overlapping the first electrode.

2. The method of claim 1 comprising positioning the photo mask at a third position and forming a third material layer above the first and second material layers based on the pattern on the photo mask, the third material layer being between the first electrode and the second electrode, the third material layer being offset from the first and second material layers so that the memory cell comprises at least the first sub-cell, the second sub-cell, and a third sub-cell.

3. The method of claim 2 wherein the third sub-cell includes the first and third material layers but not the second material layer.

4. The method of claim 2 comprising forming a fourth sub-cell that includes the first, second, and third material layers.

5. The method of claim 2 comprising positioning the photo mask at a fourth position and forming a fourth material layer above the first, second, and third material layers based on the pattern on the photo mask, the fourth layer being between the first electrode and the second electrode, the fourth material layer being offset from the first, second, and third material layers so that the memory cell comprises at least the first sub-cell, the second sub-cell, the third sub-cell, and a fourth sub-cell.

6. The method of claim 5 comprising positioning the photo mask at a fifth position and forming a fifth material layer above the first, second, third, and fourth material layers based on the pattern on the photo mask, the fifth material layer being offset from the first, second, third, and fourth material layers so that the memory cell comprises at least the first sub-cell, the second sub-cell, the third sub-cell, the fourth sub-cell, and a fifth sub-cell.

7. The method of claim 1 wherein positioning the photo mask at the second position comprises shifting the photo mask for a distance from the first position to the second position in which the distance is less than a smallest line width of the photo mask.

8. The method of claim 1 wherein forming the first layer comprises forming a layer of material having openings, the openings to allow portions of the first electrode to electrically contact portions of the second electrode.

9. The method of claim 1 wherein forming the first material layer comprises forming a semiconductor layer or a dielectric layer.

10. The method of claim 1 comprising forming circuitry for applying a write signal to the memory cell.

11. The method of claim 1 comprising forming circuitry for outputting a read signal from the memory cell.

12. A method comprising:
   fabricating a memory device having memory cells, each memory cell having at least two sub-cells, comprising
      positioning a photo mask at two or more positions, the photo mask having a predetermined pattern, and
      for each position of the photo mask, forming at least one material layer based on the predetermined pattern of the photo mask to cause different sub-cells to have different material layers or different combinations of material layers.

13. The method of claim 12 wherein fabricating the sub-cells comprises positioning the photo mask at three positions to form four sub-cells.

14. The method of claim 12 wherein fabricating the sub-cells comprises positioning the photo mask at five positions to form nine sub-cells.

15. The method of claim 12 wherein each material layer has a portion that overlaps a portion of another material layer.

16. The method of claim 12 wherein fabricating the sub-cells comprises depositing a first layer on a lower electrode, adjusting an alignment of the photo mask, and depositing a second layer on the first layer, wherein a first sub-cell includes the first layer and not the second layer, and a second sub-cell includes both the first and second layers.

17. The method of claim 12 wherein fabricating the sub-cells comprises depositing a first layer on a lower electrode, etching the first layer, adjusting an alignment of the photo mask, depositing a second layer on the first layer and an exposed portion of the lower electrode, and etching the second layer, wherein a first sub-cell includes the second layer and not the first layer, and a second sub-cell includes both the first and second layers.

18. The method of claim 12 wherein positioning the photo mask at two or more positions comprises positioning the photo mask a first position and a second position spaced apart from the first position by a distance that is less than a smallest line width of the photo mask.

19. The method of claim 12 wherein forming at least one material layer for each position of the photo mask comprises forming a layer of material having openings, the openings to allow portions of the first electrode to electrically contact portions of the second electrode.

20. The method of claim 12 wherein forming at least one material layer comprises forming at least one semiconductor or dielectric layer.

21. A method comprising:
fabricating an electronic device on a substrate using a photolithography process, including defining boundaries of components of the electronic device by positioning a photo mask at a position relative to the substrate, and shifting an alignment of the photo mask according to a sequence of steps when defining boundaries of different components, in which the smallest distance of shift during the sequence of steps is smaller than a smallest line width of the electronic device.

22. The method of claim 21, comprising forming layers of materials as the photo mask is shifted according to the sequence of steps to form material layers that are offset from one another to form components having different layers or different combinations of layers.

23. An apparatus comprising:
a lithography system comprising
a wafer stage to support a wafer,
a photo mask stage to support a photo mask,
at least one stepper motor to drive the photo mask stage,
a programmable controller to control the at least one stepper motor to move the photo mask stage according to a sequence of steps to fabricate sub-cells of memory cells on the wafer, each of some of the steps involving a movement of the photo mask stage for a distance less than the smallest line width of the photo mask such that the sub-cells have dimensions smaller than the smallest line width of the photo mask, and
a storage storing instructions that when executed cause the programmable controller to control the at least one stepper motor to move the photo mask stage according to the sequence of steps to fabricate memory cells each having a plurality of sub-cells.

24. The apparatus of claim 23 wherein the instructions when executed cause the programmable controller to control the at least one stepper motor to move the photo mask stage to position the photo mask at various locations to cause a first material layer to be formed at a position that is offset a distance relative to a position of a second material layer, forming a first sub-cell that includes the first material layer but not the second material layer, and a second sub-cell that includes both the first and second material layers, the offset distance being less than the smallest line width of the photo mask.

25. An apparatus comprising:
means for defining boundaries of sub-cells of memory cells of a memory device by positioning a photo mask at a position relative to a substrate on which the memory device is fabricated, and
means for shifting alignment of the photo mask according to a sequence of steps in which the smallest distance of shift during the sequence of steps is smaller than a smallest width of the memory cell.

* * * * *